United States Patent
Aiba et al.

(10) Patent No.: US 12,150,385 B2
(45) Date of Patent: Nov. 19, 2024

(54) PIEZOELECTRIC ACTUATOR AND INSPECTION METHOD FOR PIEZOELECTRIC ACTUATOR

(71) Applicant: Brother Kogyo Kabushiki Kaisha, Nagoya (JP)

(72) Inventors: Takashi Aiba, Nagoya (JP); Keiji Kura, Chita (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 618 days.

(21) Appl. No.: 17/471,551

(22) Filed: Sep. 10, 2021

(65) Prior Publication Data

US 2022/0102615 A1 Mar. 31, 2022

(30) Foreign Application Priority Data

Sep. 28, 2020 (JP) ................................. 2020-161792

(51) Int. Cl.
  *H10N 30/87* (2023.01)
  *H10N 30/00* (2023.01)
  (Continued)

(52) U.S. Cl.
  CPC ........... *H10N 30/871* (2023.02); *H10N 30/20* (2023.02); *H10N 30/704* (2024.05);
  (Continued)

(58) Field of Classification Search
  CPC .... H10N 30/871; H10N 30/20; H10N 30/704; H10N 30/872; H10N 30/2047;
  (Continued)

(56) References Cited

U.S. PATENT DOCUMENTS 10,276,774 B2 * 4/2019 Nakamura ........... H10N 30/053
10,944,040 B2 * 3/2021 Nanao .................. B41J 2/14233
(Continued)

FOREIGN PATENT DOCUMENTS

JP   2010-155407 A    7/2010
JP   2011-212901 A   10/2011
(Continued)

OTHER PUBLICATIONS

Sep. 10, 2021—Co-pending U.S. Appl. No. 17/471,635.
Sep. 3, 2024—(JP) Notice of Reasons for Refusal—JP App. No. 2020-161792, Eng Tran.

*Primary Examiner* — Emily P Pham
(74) *Attorney, Agent, or Firm* — Banner & Witcoff, Ltd.

(57) ABSTRACT

There is provided a piezoelectric actuator including a vibration plate; first and second piezoelectric layers; individual electrodes; a first common electrode arranged between the vibration plate and the first piezoelectric layer; a second common electrode arranged between the first piezoelectric layer and the second piezoelectric layer; a first surface electrode which is arranged on the second piezoelectric layer and which is in conduction with the first common electrode; and a second surface electrode which is arranged on the second piezoelectric layer and which is in conduction with the second common electrode. The piezoelectric actuator further comprises an inspection electrode which is arranged on the second piezoelectric layer at an end portion of the second piezoelectric layer, which is overlapped with the one of the first and second common electrodes, and which is not in conduction with any of the individual electrodes, and the first and second common electrodes.

14 Claims, 17 Drawing Sheets

(51) Int. Cl.
*H10N 30/20* (2023.01)
*B41J 2/045* (2006.01)
*B41J 2/14* (2006.01)

(52) U.S. Cl.
CPC .......... *H10N 30/872* (2023.02); *B41J 2/0451* (2013.01); *B41J 2/04581* (2013.01); *B41J 2/14233* (2013.01)

(58) Field of Classification Search
CPC ...... H10N 30/50; H10N 30/802; H10N 39/00; B41J 2/0451; B41J 2/04581; B41J 2/14233; B41J 2002/14459; B41J 2002/18
See application file for complete search history.

(56) References Cited

U.S. PATENT DOCUMENTS

| | | | |
|---|---|---|---|
| 2011/0242225 A1 | 10/2011 | Yamashita |
| 2013/0241996 A1 | 9/2013 | Hara |
| 2015/0102835 A1 | 4/2015 | Huygens et al. |

FOREIGN PATENT DOCUMENTS

| | | | |
|---|---|---|---|
| JP | 2012-121146 A | 6/2012 |
| JP | 2013-188931 A | 9/2013 |
| JP | 2014-151584 A | 8/2014 |
| JP | 2014-189017 A | 10/2014 |
| JP | 2016-68404 A | 5/2016 |

* cited by examiner

PIEZOELECTRIC ACTUATOR AND INSPECTION METHOD FOR PIEZOELECTRIC ACTUATOR

CROSS REFERENCE TO RELATED APPLICATIONS

The present application claims priority from Japanese Patent Application No. 2020-161792, filed on Sep. 28, 2020, the disclosure of which is incorporated herein by reference in its entirety.

BACKGROUND

The present disclosure relates to a piezoelectric actuator and an inspection method for the piezoelectric actuator.

As an exemplary piezoelectric actuator, such a piezoelectric actuator that the pressure is applied to an ink contained in a pressure chamber of an ink-jet head is known. In such piezoelectric actuator, a piezoelectric member may be formed by stacking three piezoelectric layers. Further, a plurality of individual electrodes, which are individually provided for a plurality of pressure chambers, may be arranged on an upper surface of the piezoelectric layer disposed on the upper side. Further, a first common electrode, which is common to the plurality of individual electrodes, may be arranged on a surface disposed between the lower piezoelectric layer and the middle piezoelectric layer. Further, a second common electrode, which is common to the plurality of individual electrodes, may be arranged on a surface disposed between the middle piezoelectric layer and the upper piezoelectric layer.

SUMMARY

According to an aspect of the present disclosure, there is provided a piezoelectric actuator including:
a vibration plate having insulation performance at least on a first surface, of the vibration plate, disposed on a first side in a first direction of the vibration plate;
a first piezoelectric layer arranged on the first surface of the vibration plate;
a second piezoelectric layer arranged on a first surface, of the first piezoelectric layer, disposed on the first side in the first direction of the first piezoelectric layer;
a plurality of individual electrodes arranged on a first surface, of the second piezoelectric layer, disposed on the first side in the first direction of the second piezoelectric layer;
a first common electrode which is arranged between the vibration plate and the first piezoelectric layer and which is common to the plurality of individual electrodes;
a second common electrode which is arranged between the first piezoelectric layer and the second piezoelectric layer and which is common to the plurality of individual electrodes;
a first surface electrode which is arranged on the first surface of the second piezoelectric layer and which is in conduction with the first common electrode; and
a second surface electrode which is arranged on the first surface of the second piezoelectric layer and which is in conduction with the second common electrode.

One of the first and second common electrodes extends to an end portion in a second direction of a surface on which the one of the first and second common electrodes is arranged, the second direction being orthogonal to the first direction.

The piezoelectric actuator further comprises an inspection electrode which is arranged on the first surface of the second piezoelectric layer at an end portion in the second direction of the second piezoelectric layer, which is overlapped in the first direction with the one of the first and second common electrodes, and which is not in conduction with any of the plurality of individual electrodes, the first common electrode, and the second common electrode.

DETAILED DESCRIPTION

Figure 1:
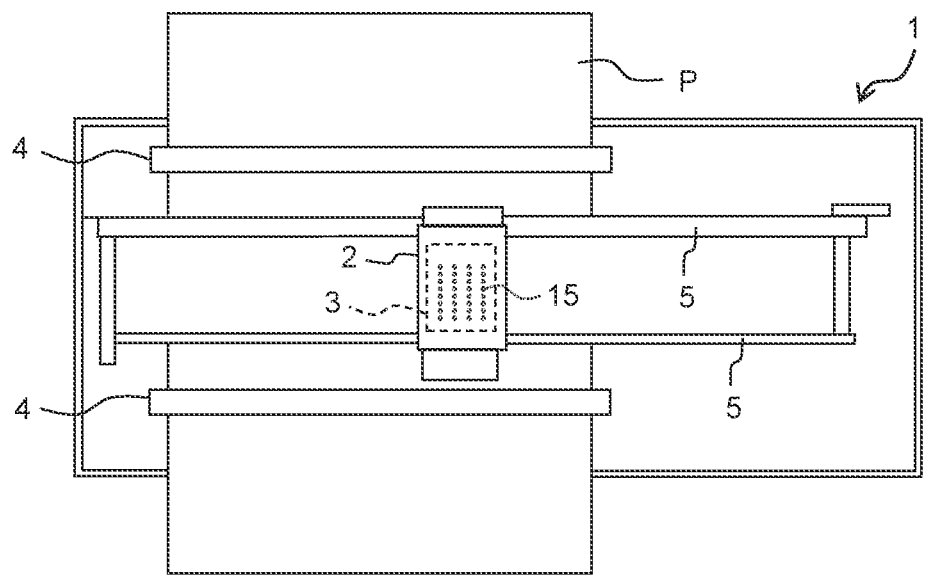
FIG. 1 depicts the overall configuration of a printer 1 including a piezoelectric actuator.
Figure 1:
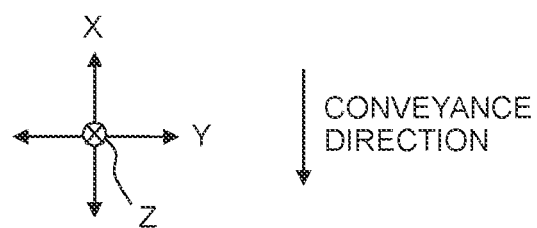

When the piezoelectric actuator described in Japanese Patent Application Laid-open No. 2014-189017 is produced or manufactured, the stack of the piezoelectric layers and the electrodes are heated. However, in this procedure, any warpage appears in the piezoelectric actuator on account of the difference in the coefficient of linear expansion between the piezoelectric layer and the electrode. If the warpage appears in the piezoelectric actuator, the electrostatic capacity (capacitance) of the portion of the piezoelectric layer interposed between the electrodes changes. In view of the above, for example, it is conceived that probes are applied to the two electrodes between which the piezoelectric layer is interposed to measure the electrostatic capacity, and the degree of the warpage of the piezoelectric actuator is grasped or comprehended on the basis of the measured electrostatic capacity.

In this context, as for the central portion of the piezoelectric actuator, other portions of the piezoelectric actuator exist over the whole circumference disposed therearound, and the warpage is easily regulated by the other portions. On the contrary, any other portion of the piezoelectric actuator does not exist at the outside of the end portion of the piezoelectric actuator, and hence the warpage is not regulated. Further, the atmosphere (temperature or the like) during the heating differs between the central portion and the end portion of the piezoelectric actuator. On account of the factors as described above, the warpage is increased at the end portion of the piezoelectric actuator.

However, any electrode, which can be used to measure the electrostatic capacity as described above, does not exist at the end portion of the piezoelectric actuator described in Japanese Patent Application Laid-open No. 2014-189017. Note that a first connecting terminal and the first common electrode, and a second connecting terminal and the second common electrode are arranged while interposing the piezoelectric layer respectively at the end portion of the piezoelectric actuator described in Japanese Patent Application Laid-open No. 2014-189017. However, the first connecting terminal and the first common electrode, and the second connecting terminal and the second common electrode are in conduction via through-holes respectively. Therefore, they cannot be used to measure the electrostatic capacity as described above. As a result, it is impossible to grasp the degree of the warpage at the end portion of the piezoelectric actuator.

If the degree of the warpage cannot be grasped at the end portion of the piezoelectric actuator, an ink-jet head may be produced or manufactured in some cases by using any piezoelectric actuator in which the warpage is large at the end portion. In this case, it is feared that the piezoelectric layer may be broken when the piezoelectric actuator is connected to a flow passage member or a wiring member such as COF or the like. Further, it is also feared that any problem may occur, for example, such that any difference arises in the discharge characteristic of the ink discharged from the nozzle between the central portion and the end portion.

An object of the present disclosure is to provide a piezoelectric actuator which makes it possible to grasp the degree of the warpage at the end portion, and an inspection method for the piezoelectric actuator.

A preferred embodiment of the present disclosure will be explained below. In the following explanation, the X direction and the Y direction are orthogonal to the Z direction, and the X direction and the Y direction are orthogonal to one another. For example, the Z direction is the vertical direction, and the X direction and the Y direction are the horizontal directions. Note that the Z direction is an example of the "first direction" of the present invention, the Y direction is an example of the "second direction" of the present invention, and the X direction is an example of the "third direction" of the present invention. Further, the upper side in the Z direction is an example of the "first side in the first direction" of the present invention, and the lower side in the Z direction is an example of the "second side in the first direction" of the present invention. Further, the left side as viewed in FIG. 1 in the Y direction is an example of the "first side in the second direction" of the present invention, and the right side as viewed in FIG. 1 is an example of the "second side in the second direction" of the present invention.

<Overall Configuration of Printer 1>

As depicted in FIG. 1, a printer 1 according to an embodiment of the present disclosure is provided with a carriage 2, a head 3, and two (a pair of) conveying rollers 4.

The carriage 2 is supported by two guide rails 5 extending in the Y direction, and the carriage 2 is movable in the Y direction along the guide rails 5.

The head 3 is based on the serial type. The head 3 is carried on the carriage 2, and the head 3 is movable in the Y direction together with the carriage 2. A plurality of nozzles 15 are formed on the lower surface of the head 3.

The two conveying rollers 4 are arranged while interposing the carriage 2 between two conveying rollers 4 in the X direction. The pair of conveying rollers 4 are rotated in a state in which the printing paper P is interposed, and thus the printing paper P is conveyed in the conveying direction along with the X direction.

A control unit (not shown) of the printer 1 alternately performs the discharge action in which the inks are discharged from the nozzles 15 while moving the head 3 in the Y direction together with the carriage 2, and the conveying action in which the printing paper P is conveyed by a predetermined amount in the conveying direction by means of the pair of conveying rollers 4. Accordingly, an image is recorded on the printing paper P.

<Configuration of Head 3>

Figure 2:
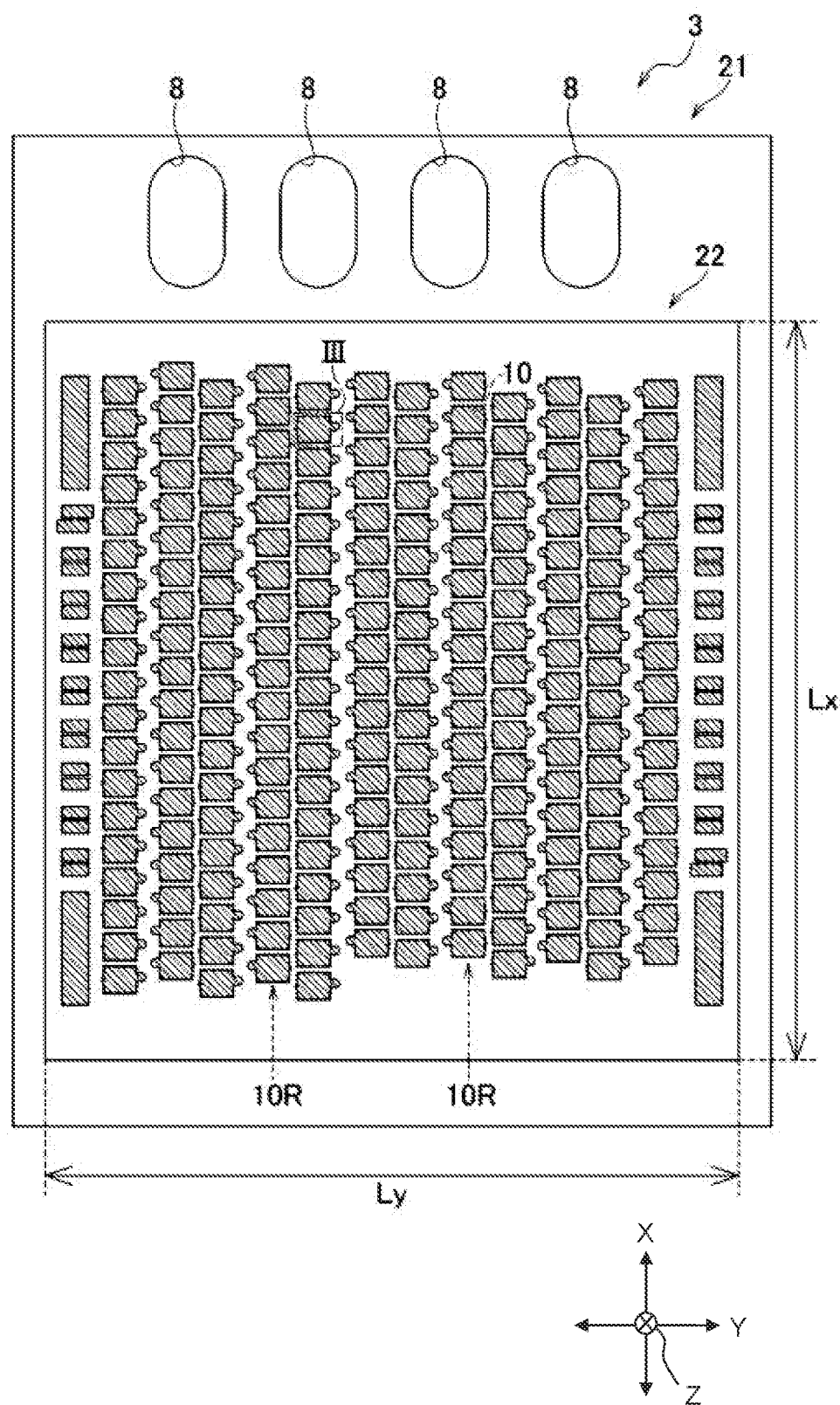
FIG. 2 depicts a plan view illustrating a head 3 shown in FIG. 1.

As depicted in FIG. 2, the head 3 has a channel unit (a flow passage unit) 21 and a piezoelectric actuator 22.

<Channel Unit 21>

Figure 3:
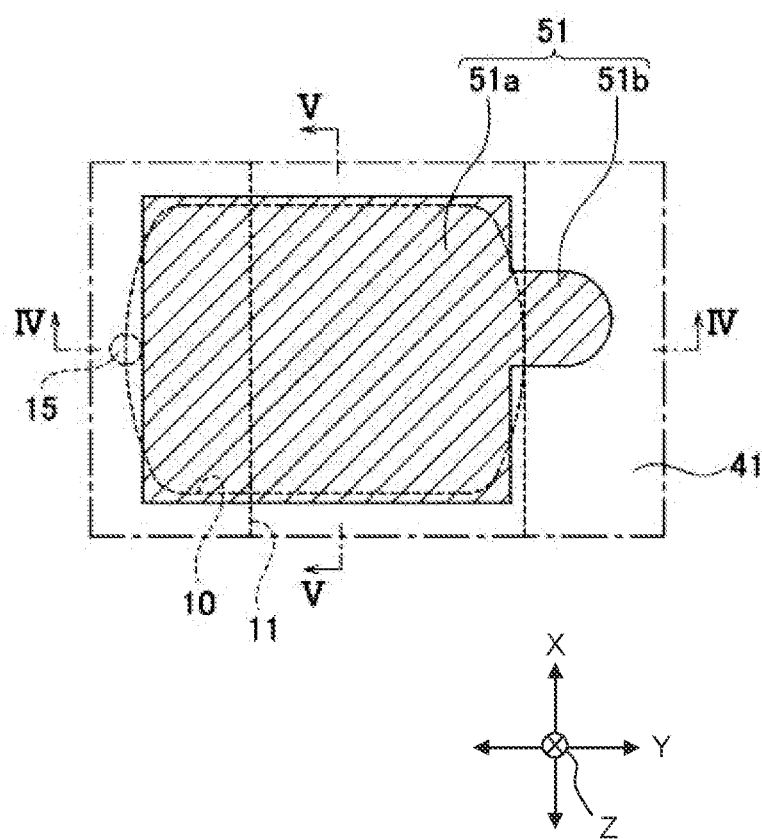
FIG. 3 depicts an enlarged view illustrating an area III shown in FIG. 2.
Figure 4:
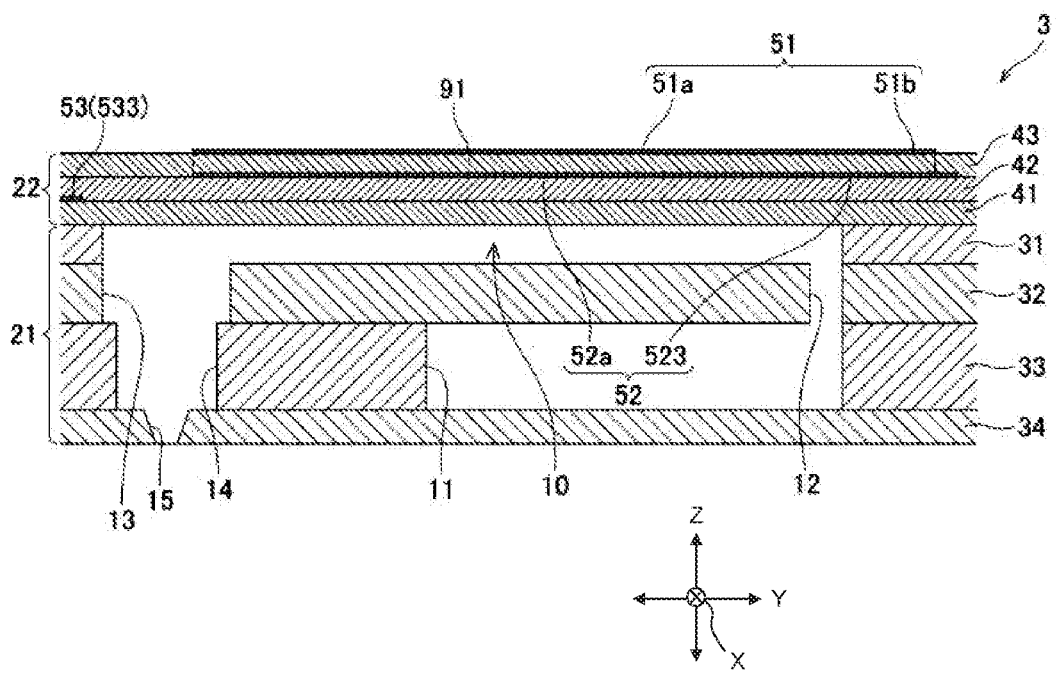
FIG. 4 depicts a sectional view taken along a line IV-IV shown in FIG. 3.

As depicted in FIGS. 2 to 4, the channel unit 21 has a rectangular shape as obtained by being projected in the Z direction, and the channel unit 21 is composed of four plates 31 to 34 which are stacked in the Z direction.

The plate 31 is formed with a plurality of pressure chambers 10. The plate 32 is formed with communication channel 12, 13 each of which is provided for each of the pressure chambers 10. The communication channels 12, 13 are overlapped in the Z direction with one end portion and the other end portion in the Y direction of the corresponding pressure chamber 10 respectively. The plate 33 is formed with communication channels 14 each of which is provided for each of the communication channels 13. The communication channel 14 is overlapped in the Z direction with the corresponding communication channel 13. The plate 33 is further formed with twelve manifold channels 11. Each of the manifold channels 11 is provided for each of arrays 10R of the pressure chambers 10 arranged in the X direction. Each of the manifold channels 11 extends in the X direction, which is communicated via the communication channels 12 with the plurality of pressure chambers 10 belonging to the corresponding array 10R. The plate 34 is formed with the plurality of nozzles 15. Each of the nozzles 15 is overlapped in the Z direction with the communication channel 14.

Four ink supply ports 8 are formed in an area in which the piezoelectric actuator 22 is not arranged on the upper surface of the plate 31. Each of the ink supply ports 8 is communicated with an ink cartridge (not shown), for example, via a tube (not shown). Further, each of the ink supply ports 8 is communicated with three manifold channels 11. The ink, which is supplied from the ink cartridge to each of the ink supply ports 8, is supplied to the three manifold channels 11. The ink is supplied from each of the manifold channels 11 to the plurality of pressure chambers 10 belonging to each of the arrays OR via the communication channel 12.

<Piezoelectric Actuator 22>

As depicted in FIGS. 2 to 5, the piezoelectric actuator 22 is arranged on the upper surface of the channel unit 21. The piezoelectric actuator 22 has a vibration plate 41, a first piezoelectric layer 42, and a second piezoelectric layer 43 which are stacked in the Z direction while using the Z direction as the thickness direction respectively, a plurality of individual electrodes 51, a high electric potential electrode 52 (an example of "second common electrode" of the present invention), and a low electric potential electrode 53 (an example of "first common electrode" of the present invention).

The vibration plate 41 is arranged on the upper surface of the channel unit 21 (plate 31). The first piezoelectric layer 42 is arranged on the upper surface of the vibration plate 41. The second piezoelectric layer 43 is arranged on the upper surface of the first piezoelectric layer 42.

Each of the vibration plate 41, the first piezoelectric layer 42, and the second piezoelectric layer 43 is composed of a piezoelectric material containing a main component of, for example, lead zirconate titanate as a mixed crystal of titanic acid and lead zirconate. However, the vibration plate 41 may be composed of an insulating material other than the piezoelectric material. Alternatively, the vibration plate 41 may be formed, for example, by an ink separation layer which is composed of, for example, a metal material such as stainless steel or the like or a synthetic resin material and which is arranged on the upper surface of the channel unit 21, and an insulating layer which is composed of an insulating material such as a piezoelectric material or the like and which is arranged on the upper surface of the ink separation layer. That is, it is appropriate for the vibration plate 41 that at least a portion for forming the upper surface thereof has the insulation performance.

Each of the vibration plate 41, the first piezoelectric layer 42, and the second piezoelectric layer 43 has a thickness (length in the Z direction) of, for example, about 15 sm. Further, as for the vibration plate 41, the first piezoelectric layer 42, and the second piezoelectric layer 43, the length Ly in the Y direction is shorter than the length Lx in the X direction. For example, Ly is about 30 to 35 mm, and Lx is about 35 to 40 mm. Accordingly, in the case of the piezoelectric actuator 22, the length in the Y direction is shorter than the length in the X direction.

As depicted in FIG. 3, the plurality of individual electrodes 51 are arranged while corresponding to the pressure chambers 10 respectively on the upper surface of the second piezoelectric layer 43. Each of the individual electrodes 51 has a main portion 5la and a protruding portion 51b. The main portion 51a is overlapped in the Z direction with an approximately entire region of the corresponding pressure chamber 10. The protruding portion 51b protrudes in the Y direction from the main portion 51a, and the protruding portion 51b is not overlapped in the Z direction with the corresponding pressure chamber 10. The protruding portion 51b is provided with a contact which is to be electrically connected to COF (Chip On Film) (not shown). Driver IC (not shown), which is mounted on COF, selectively applies any one of the high electric potential (VDD electric potential) and the low electric potential (GND electric potential) individually to each of the individual electrodes 51 via the wiring of COF in accordance with the control performed by the control unit.

Figure 6:
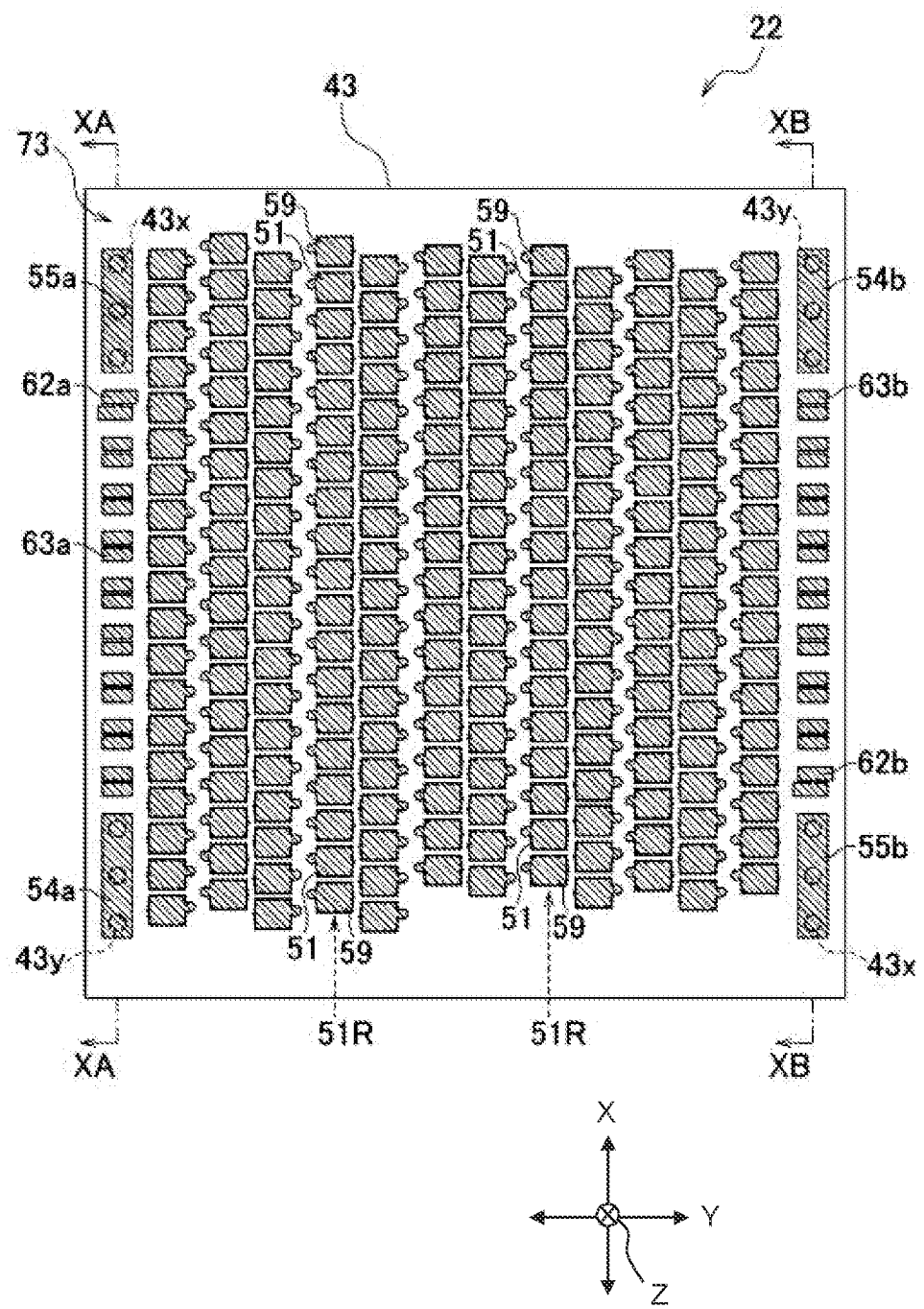
FIG. 6 depicts a plan view illustrating an upper surface of a second piezoelectric layer 43.

As depicted in FIG. 6, the plurality of individual electrodes 51 are arranged in the X direction in an area of the upper surface of the second piezoelectric layer 43 except for both end portions in the X direction and both end portions in the Y direction of the second piezoelectric layer 43. The plurality of individual electrodes 51 form a plurality of driving electrode arrays 51R corresponding to the arrays 10R of the pressure chambers 10 (see FIG. 2) respectively. The plurality of driving electrode arrays 51R are aligned in the Y direction.

Dummy electrodes 59 are provided on the first side (upper side as viewed in FIG. 6) and the second side (lower side as viewed in FIG. 6) in the X direction respectively for each of the driving electrode arrays 51R. The dummy electrode 59 has the same size and the same shape as those of the individual electrode 51 belonging to the corresponding driving electrode array 51R. The dummy electrodes 59 are aligned at equal intervals in the X direction together with the individual electrodes 51. The dummy electrode 59 is not electrically connected to COF, and no electric potential is applied to the dummy electrodes 59. Owing to the provision of the dummy electrodes 59, even if the thickness of the dummy electrode 59 disposed at the end portion in the X direction is decreased during the electrode formation by means of the screen printing in the X direction, then the thickness of the individual electrode 51 is not affected, and the individual electrode 51 can be appropriately formed. Further, it is possible to suppress the difference in the shrinkage amount caused by the electrode formation between the individual electrode 51 which is disposed at the center in the X direction and the individual electrode 51 which is disposed at the end portion in the X direction in relation to each of the driving electrode arrays 51R. Consequently, it is possible to suppress the dispersion of the discharge amounts from the plurality of nozzles 15 corresponding to each of the driving electrode arrays 51R.

First surface electrodes 54a, 54b, second surface electrodes 55a, 55b, a plurality of non-conductive electrodes 63a, 63b, and inspection electrodes 62a, 62b are arranged on the upper surface of the second piezoelectric layer 43 in addition to the individual electrodes 51 and the dummy electrodes 59.

Figure 7A:
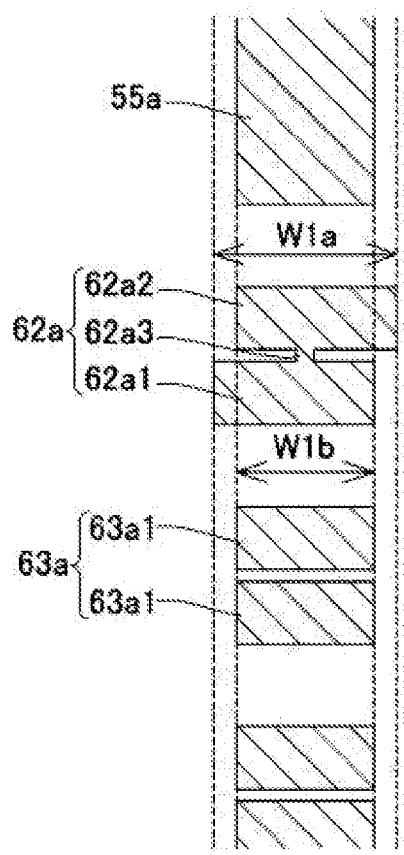
FIG. 7A depicts an enlarged view illustrating an inspection electrode 62a shown in FIG. 6 and some electrodes aligned therewith in the X direction.
Figure 7B:
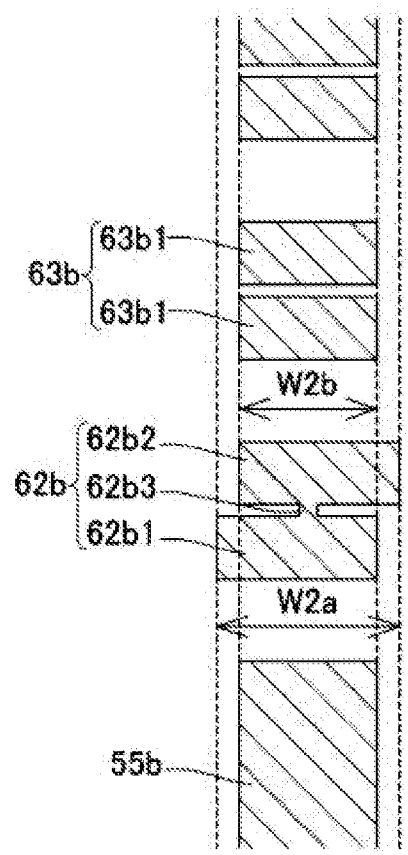
FIG. 7B depicts an enlarged view illustrating an inspection electrode 62b shown in FIG. 6 and some electrodes aligned therewith in the X direction.
Figure 7B:
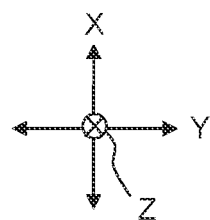
Figure 7B:
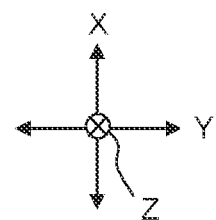
Figure 10A:
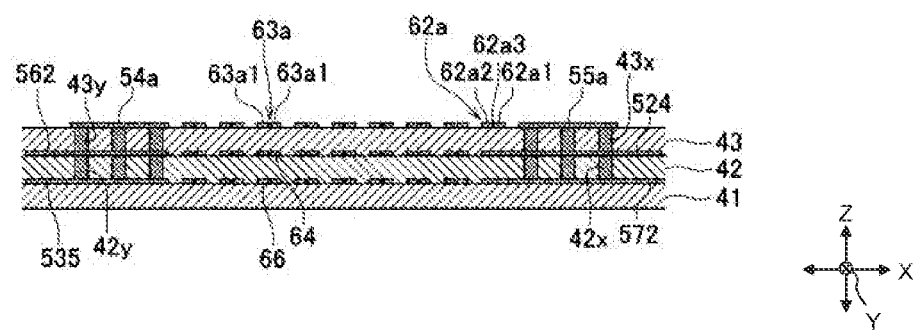
FIG. 10A depicts a sectional view taken along a line XA-XA shown in FIGS. 6, 8, and 9.
Figure 10B:
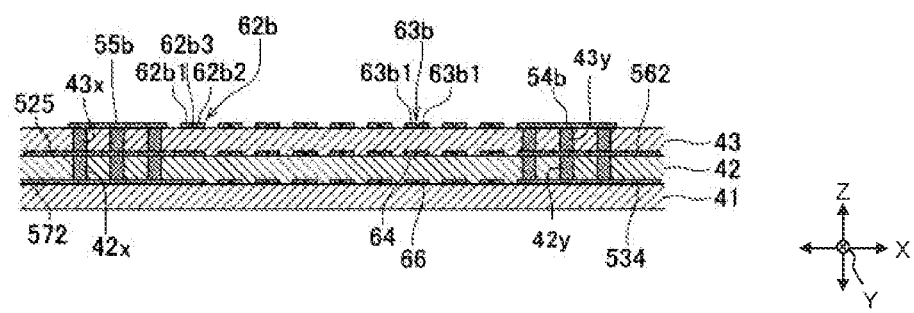
FIG. 10B depicts a sectional view taken along a line XB-XB shown in FIGS. 6, 8, and 9.

As depicted in FIGS. 6, 7A, and 10A, the first surface electrode 54a is arranged at the second end portion in the X direction (lower-left end portion as viewed in FIG. 6) in the area of the first end portion in the Y direction (left end portion as viewed in FIG. 6) of the upper surface of the second piezoelectric layer 43. As depicted in FIGS. 6, 7B, and 10B, the first surface electrode 54b is arranged at the first end portion in the X direction (upper-right end portion as viewed in FIG. 6) in the area of the second end portion in the Y direction (right end portion as viewed in FIG. 6) of the upper surface of the second piezoelectric layer 43. The first surface electrodes 54a, 54b extend in the X direction.

As depicted in FIGS. 6, 7A, and 10A, the second surface electrode 55a is arranged at the first end portion in the X direction (upper-left end portion as viewed in FIG. 6) in the area of the first end portion in the Y direction (left end portion as viewed in FIG. 6) of the upper surface of the second piezoelectric layer 43. As depicted in FIGS. 6, 7B, and 10B, the second surface electrode 55b is arranged at the second end portion in the X direction (lower-right end portion as viewed in FIG. 6) in the area of the second end portion in the Y direction (right end portion as viewed in FIG. 6) of the upper surface of the second piezoelectric layer 43. The second surface electrodes 55a, 55b extend in the X direction.

Further, the position in the Y direction of the first surface electrode 54a is the same as that of the second surface electrode 55a. Then, the first surface electrode 54a and the second surface electrode 55a are arranged while providing a space therebetween in the X direction. Further, the position in the Y direction of the first surface electrode 54b is the same as that of the second surface electrode 55b. Then, the first surface electrode 54b and the second surface electrode 55b are arranged while providing a space therebetween in the X direction.

As depicted in FIGS. 6, 7A, and 10A, the plurality of non-conductive electrodes 63a are arranged between the first surface electrode 54a and the second surface electrode 55a, and the plurality of non-conductive electrodes 63a are aligned in the X direction. As depicted in FIGS. 6, 7B, and 10B, the plurality of non-conductive electrodes 63b are arranged between the first surface electrode 54b and the second surface electrode 55b, and the plurality of non-conductive electrodes 63b are aligned in the X direction. Further, each of the non-conductive electrodes 63a is divided into two electrode portions 63a1 which are aligned in the X direction. Further, each of the non-conductive electrodes 63b is divided into two electrode portions 63b1 which are aligned in the X direction. The shapes of the electrode portions 63a1, 63b1, which are obtained by the projection in the Z direction, are oblongs (rectangles) in which the Y direction is the longitudinal direction. Further, the lengths in the Y direction of the electrode portions 63a1, 63b1 are approximately the same as the lengths in the Y direction of the first surface electrode 54a and the second surface electrode 55a. Further, in the Y direction, the positions of the two electrode portions 63a1 and the positions of the two electrode portions 63b1 are identical with each other respectively. Further, in the X direction, the space between the electrode portions 63a1 of each of the non-conductive electrodes 63a and the space between the electrode portions 63b1 of each of the non-conductive electrodes 63b are smaller than the space between the non-conductive electrodes 63a and the space between the non-conductive electrodes 63b.

In this context, the reason, why the non-conductive electrodes 63a, 63b are divided into the two electrode portions 63a1 and the two electrode portions 63b1 respectively, is that it is intended to suppress any warpage at the end portions in the Y direction of the piezoelectric actuator 22 during the heating when the piezoelectric actuator is manufactured. However, unlike the foregoing configuration, each of the non-conductive electrodes 63a, 63b may be one electrode which is not divided.

As depicted in FIGS. 6, 7A, and 10A, the inspection electrode 62a is arranged between the second surface electrode 55a and the non-conductive electrode 63a disposed most closely to the second surface electrode 55a (disposed on the uppermost side as viewed in FIG. 7A). Accordingly, the inspection electrode 62a and the plurality of non-conductive electrodes 63a are aligned between the first surface electrode 54a and the second surface electrode 55a. The inspection electrode 62a has two electrode portions 62a1, 62a2 and a connecting portion 62a3.

The shape of the electrode portion 62a1, which is obtained by the projection in the Z direction, is an oblong in which the Y direction is the longitudinal direction and the length in the Y direction is longer than that of the electrode portion 63a1. In the Y direction, the end on the first side of the electrode portion 62a1 (left side as viewed in FIG. 7A) is positioned on the first side as compared with the end on the first side of the non-conductive electrode 63a. Further, in the Y direction, the position of the end on the second side of the electrode portion 62a1 (right side as viewed in FIG. 7A) is the same as the position of the end on the second side of the non-conductive electrode 63a.

The electrode portion 62a2 is positioned on the first side in the X direction of the electrode portion 62a1 (upper side as viewed in FIG. 7A). The shape of the electrode portion 62a2, which is obtained by the projection in the Z direction, is an oblong in the same manner as the electrode portion 62a1. In the Y direction, the position of the end on the first side of the electrode portion 62a2 (left side as viewed in FIG. 7A) is the same as the position of the end on the first side of the non-conductive electrode 63a. Further, in the Y direction, the end on the second side of the electrode portion 62a2 (right side as viewed in FIG. 7A) is positioned on the second side as compared with the end on the second side of the non-conductive electrode 63a.

Then, owing to the arrangement of the electrode portion 62a1 and the electrode portion 62a2 as described above, the electrode portion 62a2 is deviated toward the second side in the Y direction (right side as viewed in FIG. 7A) with respect to the electrode portion 62a1.

Further, the electrode portion 62a1 and the electrode portion 62a2 are arranged while providing a gap in the X direction. The length in the X direction of the gap is, for example, approximately equivalent to the space between the electrode portions 63a1 of the non-conductive electrode 63a. The connecting portion 62a3 is arranged at the gap between the electrode portion 62a1 and the electrode portion 62a2, and the connecting portion 62a3 connects the electrode portion 62a1 and the electrode portion 62a2.

Then, owing to the configuration of the inspection electrode 62a as described above, the length W1a between the end on the first side and the end on the second side in the Y direction of the inspection electrode 62a is longer than the length W1b in the Y direction of the non-conductive electrode 63a (length between the end on the first side and the end on the second side).

As depicted in FIGS. 6, 7B, and 10B, the inspection electrode 62b is arranged between the second surface electrode 55b and the non-conductive electrode 63b disposed most closely to the second surface electrode 55b (disposed on the lowermost side as viewed in FIG. 7B). Accordingly, the inspection electrode 62b and the plurality of non-conductive electrodes 63b are aligned between the first surface electrode 54b and the second surface electrode 55b. The inspection electrode 62b has two electrode portions 62b1, 62b2 and a connecting portion 62b3.

The sizes and the shapes of the electrode portions 62*b*1, 62*b*2 and the connecting portion 62*b*3 are the same as those of the electrode portions 62*a*1, 62*a*2 and the connecting portion 62*a*3 respectively. Then, in the Y direction, the end on the first side of the electrode portion 62*b*1 (left side as viewed in FIG. 7B) is positioned on the first side as compared with the end on the first side of the non-conductive electrode 63*b*. Further, in the Y direction, the position of the end on the second side of the electrode portion 62*b*1 (right side as viewed in FIG. 7B) is the same as the position of the end on the second side of the non-conductive electrode 63*b*. Further, in the Y direction, the position of the end on the first side of the electrode portion 62*b*2 (left side as viewed in FIG. 7B) is the same as the position of the end on the first side of the non-conductive electrode 63*b*. Further, in the Y direction, the end on the second side of the electrode portion 62*b*2 (right side as viewed in FIG. 7B) is positioned on the second side as compared with the end on the second side of the non-conductive electrode 63*b*.

Then, owing to the arrangement of the electrode portion 62*b*1 and the electrode portion 62*b*2 as described above, the electrode portion 62*b*2 is deviated toward the second side in the Y direction (right side as viewed in FIG. 7B) with respect to the electrode portion 62*b*1. Further, owing to the configuration of the inspection electrode 62*b* as described above, the length W2*a* between the end on the first side and the end on the second side in the Y direction of the inspection electrode 62*b* is longer than the length W2*b* in the Y direction of the non-conductive electrode 63*b* (length between the end on the first side and the end on the second side).

The first surface electrodes 54*a*, 54*b* and the second surface electrodes 55*a*, 55*b* are electrically connected to COF (not shown). The driver IC (not shown) applies the low electric potential (GND electric potential) to the first surface electrodes 54*a*. 54*b* and applies the high electric potential (VDD electric potential) to the second surface electrodes 55*a*, 55*b*, via the wiring of COF in accordance with the control performed by the control unit. On the other hand, the non-conductive electrodes 63*a*, 63*b* and the inspection electrodes 62*a*, 62*b* are not electrically connected to COF. Further, the non-conductive electrodes 63*a*, 63*b* and the inspection electrodes 62*a*, 62*b* are not in conduction with any one of the individual electrodes 51, the high electric potential electrode 52, and the low electric potential electrode 53, and no electric potential is applied to the non-conductive electrodes 63*a*, 63*b* and the inspection electrodes 62*a*. 62*b*.

Figure 5:
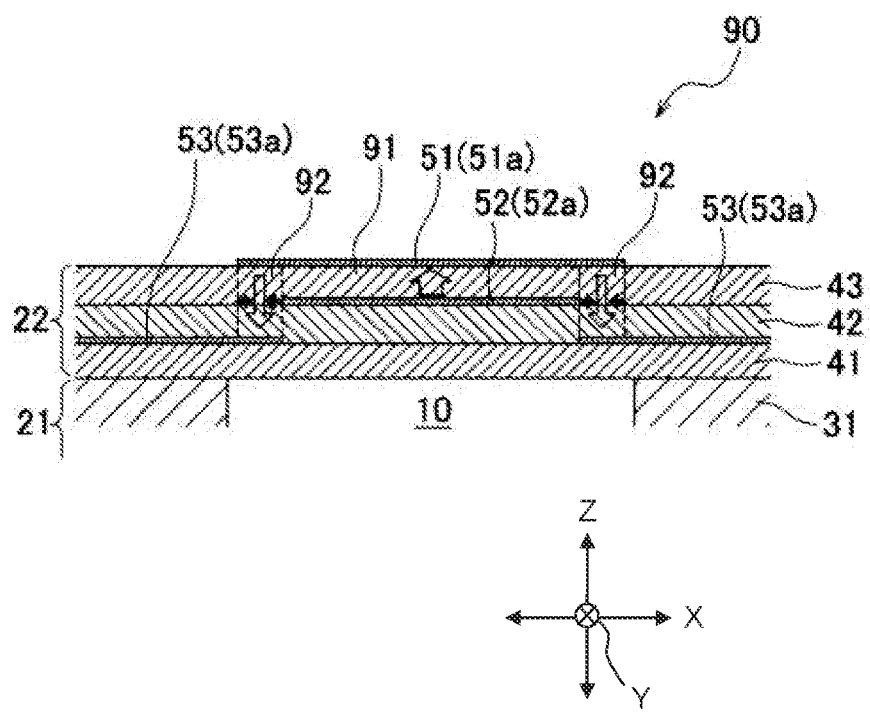
FIG. 5 depicts a sectional view taken along a line V-V shown in FIG. 3.

As depicted in FIGS. 4 and 5, the high electric potential electrode 52 is arranged on the upper surface of the first piezoelectric layer 42 (surface between the first piezoelectric layer 42 and the second piezoelectric layer 43).

Figure 8:
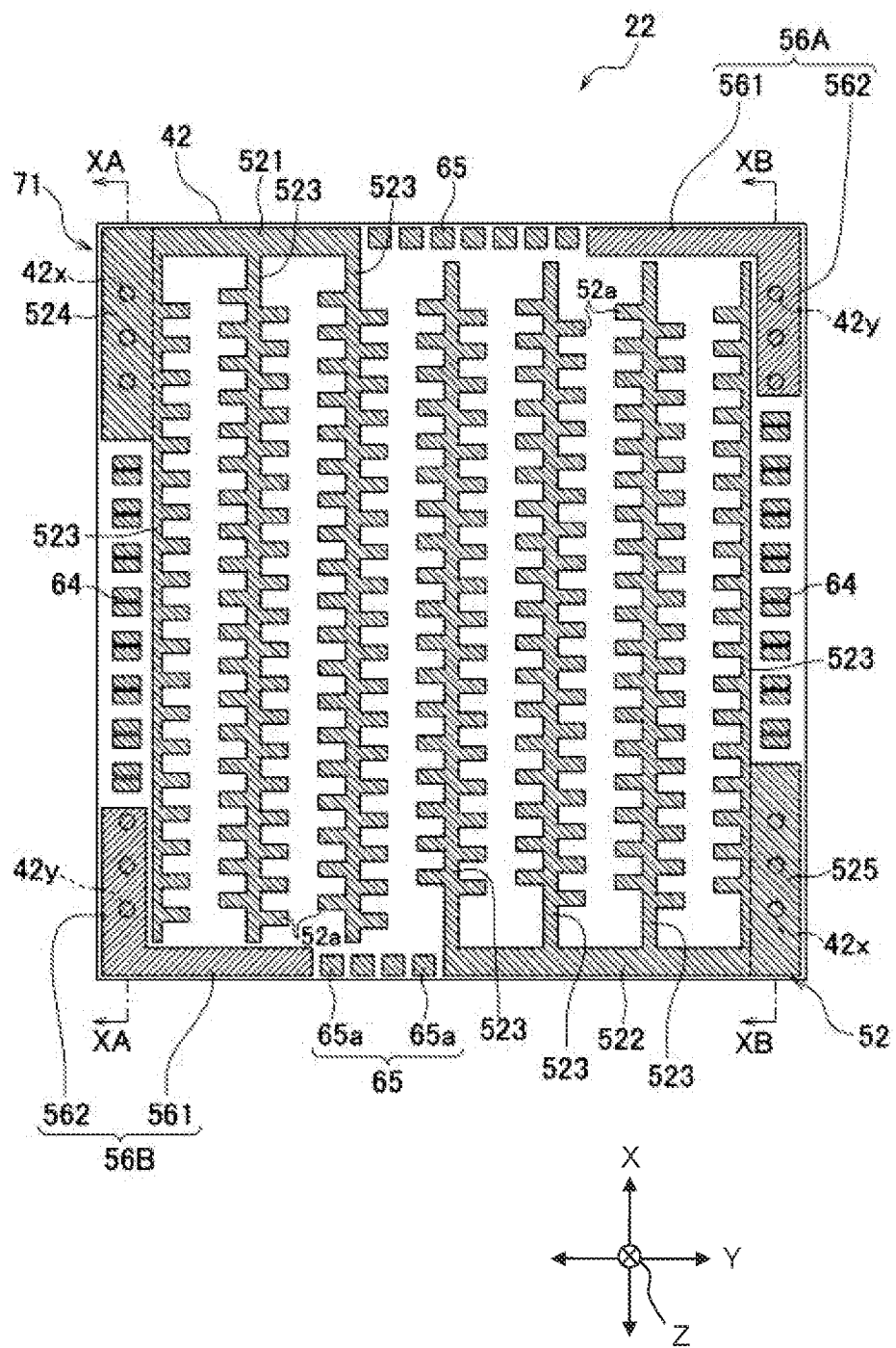
FIG. 8 depicts a plan view illustrating an upper surface of a first piezoelectric layer 42.

Further, as depicted in FIGS. 8, 10A, and 10B, the high electric potential electrode 52 includes two stem portions 521, 522 which extend in the Y direction, a plurality of branch portions 523 which are branched from the respective stem portions 521, 522 and which extend in the X direction, a plurality of individual portions 52*a* which are arranged in the X direction and which are connected by the branch portions 523, and connecting portions 524, 525 (an example of "overlapped portions" of the present invention) which are overlapped in the Z direction with the second surface electrodes 55*a*, 55*b*, respectively. The respective individual portions 52*a* correspond to the respective pressure chambers 10, and they are overlapped in the Z direction with the central portions in the X direction of the respective pressure chambers 10 (see FIG. 5). The respective stem portions 521, 522 connect the plurality of branch portions 523.

The stem portion 521 is arranged at the portion of the first piezoelectric layer 42 disposed on the first side in the Y direction (left side as viewed in FIG. 8) at the first end portion in the X direction (upper end portion as viewed in FIG. 8). The stem portion 522 is arranged at the portion of the first piezoelectric layer 42 disposed on the second side in the Y direction (right side as viewed in FIG. 8) at the second end portion in the X direction (lower end portion as viewed in FIG. 8).

The three branch portions 523 extend in the X direction from the stem portion 521 from the first end in the X direction (upper end as viewed in FIG. 8) of the first piezoelectric layer 42 toward the second end (lower end as viewed in FIG. 8). The four branch portions 523 extend in the X direction from the stem portion 522 from the second end in the X direction (lower end as viewed in FIG. 8) of the first piezoelectric layer 42 toward the first end (upper end as viewed in FIG. 8). The branch portions 523, which are branched from the respective stem portions 521, 522, are aligned in the Y direction.

As depicted in FIGS. 8 and 10A, the connecting portion 524 extends in the X direction to range over the second surface electrode 55*a* and the inspection electrode 62*a* at the first end portion in the Y direction (left end portion as viewed in FIG. 8) of the first piezoelectric layer 42. The connecting portion 524 is overlapped in the Z direction with the second surface electrode 55*a* and the inspection electrode 62*a*. Further, the connecting portion 524 is connected to the first end in the Y direction (left end as viewed in FIG. 8) of the stem portion 521, and the connecting portion 524 is connected to the branch portion 523 positioned on the first side in the Y direction of any other branch portion 523 branched from the stem portion 521 (leftmost branch portion among the plurality of branch portions 523 as viewed in FIG. 8).

As depicted in FIGS. 8 and 10B, the connecting portion 525 extends in the X direction to range over the second surface electrode 55*b* and the inspection electrode 62*b* at the second end portion in the Y direction (right end portion as viewed in FIG. 8) of the first piezoelectric layer 42. The connecting portion 525 is overlapped in the Z direction with the second surface electrode 55*b* and the inspection electrode 62*b*. Further, the connecting portion 525 is connected to the second end in the Y direction (right end as viewed in FIG. 8) of the stem portion 522, and the connecting portion 525 is connected to the branch portion 523 positioned on the second side in the Y direction of any other branch portion 523 branched from the stem portion 522 (rightmost branch portion among the plurality of branch portions 523 as viewed in FIG. 8).

The connecting portions 524, 525 are in conduction with the second surface electrodes 55*a*, 55*b* respectively via through-holes 43*x* formed through the second piezoelectric layer 43.

Connecting electrodes 56A, 56B and pluralities of non-conductive electrodes 64, 65 are arranged on the upper surface of the first piezoelectric layer 42 (surface between the first piezoelectric layer 42 and the second piezoelectric layer 43) in addition to the high electric potential electrode 52.

As depicted in FIG. 8, the connecting electrodes 56A, 56B have L-shaped forms respectively, and they have portions 561 which extend in the Y direction and portions 562 which extend in the X direction. The connecting electrode 56A is arranged at a corner portion which is disposed on the first side in the X direction of the first piezoelectric layer 42

(upper side as viewed in FIG. 8) and which is disposed on the second side in the Y direction (right side as viewed in FIG. 8). The connecting electrode 56B is arranged at a corner portion which is disposed on the second side in the X direction of the first piezoelectric layer 42 (lower side as viewed in FIG. 8) and which is disposed on the first side in the Y direction (left side as viewed in FIG. 8).

As depicted in FIGS. 8, 10A, and 10B, the portions 562 of the connecting electrodes 56A. 56B are in conduction with the first surface electrodes 54a, 54b respectively via through-holes 43y formed through the second piezoelectric layer 43.

The portion 561 of the connecting electrode 56A is overlapped in the X direction with the first and second branch portions 523 as counted from the right as viewed in FIG. 8, and is overlapped in the X direction with the three arrays disposed on the right side as viewed in FIG. 6 of the plurality of driving electrode arrays 51R. The portion 561 of the connecting electrode 56B is overlapped in the X direction with the first and second branch portions 523 as counted from the left as viewed in FIG. 8, and is overlapped in the X direction with the three arrays disposed on the left side as viewed in FIG. 6 of the plurality of driving electrode arrays 51R.

The plurality of non-conductive electrodes 64 are arranged between the connecting portion 524 and the portion 562 of the connecting electrode 56B and between the connecting portion 525 and the portion 562 of the connecting electrode 56A, and the plurality of non-conductive electrodes 64 are aligned while providing spaces therebetween in the X direction. The plurality of non-conductive electrodes 64 are provided individually for the plurality of non-conductive electrodes 63a, 63b and the inspection electrodes 62a, 62b, and they are overlapped in the Z direction with the corresponding non-conductive electrodes 63a, 63b or the inspection electrodes 62a, 62b. The non-conductive electrodes 64 are the electrodes which have the same sizes and the same shapes as those of the non-conductive electrodes 63a, 63b.

The plurality of non-conductive electrodes 65 are arranged between the stem portion 521 and the portion 561 of the connecting electrode 56A and between the stem portion 522 and the portion 561 of the connecting electrode 56B, and they are aligned while providing spaces therebetween in the Y direction.

The non-conductive electrodes 64, 65 are not in conduction with any one of the individual electrodes 51, the high electric potential electrode 52, and the low electric potential electrode 53, and no electric potential is applied to the non-conductive electrodes 64, 65.

As depicted in FIGS. 4 and 5, the low electric potential electrode 53 is arranged on the upper surface of the vibration plate 41 (surface between the vibration plate 41 and the first piezoelectric layer 42).

Figure 9:
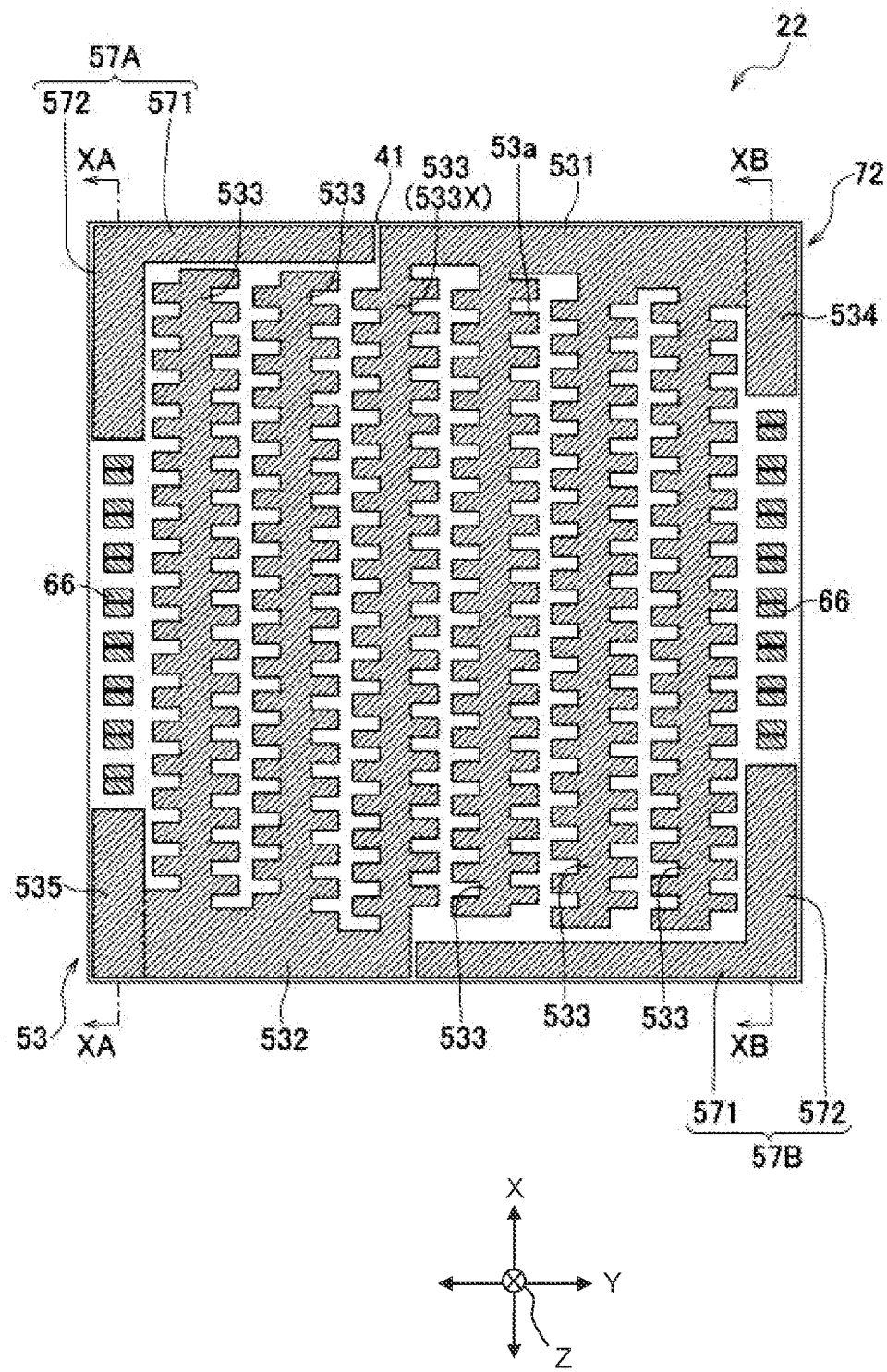
FIG. 9 depicts a plan view illustrating an upper surface of a vibration plate 41.

As depicted in FIGS. 9, 10A, and 10B, the low electric potential electrode 53 includes two stem portions 531, 532 which extend in the Y direction, a plurality of branch portions 533 which are branched from the respective stem portions 531, 532 and which extend in the X direction, a plurality of individual portions 53a which are arranged in the X direction and which are connected by the branch portions 533, and connecting portions 534, 535 which are overlapped in the Z direction with the first surface electrodes 54a, 54b (see FIG. 6) respectively. Except for the individual portions 53a which are included in the plurality of individual portions 53a arranged in the X direction and which are positioned at both ends in the X direction of the arrangement, each of the individual portions 53a spreads over or extends over the two pressure chambers 10 disposed adjacently to one another in the X direction and has portions which are overlapped in the Z direction with the end portions in the X direction of the two pressure chambers (see FIG. 5). The individual portions 53a, which are positioned at both ends in the X direction of the arrangement, each has a portion which is overlapped in the Z direction with the end portion in the X direction of one pressure chamber 10. The respective stem portions 531, 532 connect the plurality of branch portions 533.

The stem portion 531 is arranged at the portion of the vibration plate 41 disposed at the first end portion in the X direction (upper end portion as viewed in FIG. 9) on the second side in the Y direction (right side as viewed in FIG. 9). The stem portion 532 is arranged at the portion of the vibration plate 41 disposed at the second end portion in the X direction (lower end portion as viewed in FIG. 9) on the first side in the Y direction (left side as viewed in FIG. 9). The stem portions 531, 532 extend in the Y direction.

The four branch portions 533 extend in the X direction from the stem portion 531 from the first end in the X direction (upper end as viewed in FIG. 9) of the second piezoelectric layer 43 toward the second end (lower end as viewed in FIG. 9). The three branch portions 533 extend in the X direction from the stem portion 532 from the second end in the X direction (lower end as viewed in FIG. 9) of the second piezoelectric layer 43 toward the first end (upper end as viewed in FIG. 9).

The branch portions 533, which are branched from the respective stem portions 531, 532, are aligned in the Y direction. In this case, the branch portion 533X, which is positioned on the first side in the Y direction of any other branch portion 533 branched from the stem portion 531 (leftmost among them as viewed in FIG. 9), is connected to the stem portion 532. In other words, the stem portion 533X, which is positioned on the one side in the Y direction of any other branch portion 533 branched from the stem portion 531 (leftmost among the four branch portions 533 as viewed in FIG. 9), is the same as the branch portion 533X which is positioned on the second side in the Y direction of the any other branch portion 533 branched from the stem portion 532 (rightmost among the three branch portions 533 as viewed in FIG. 9). As for the branch portion 533X, one end in the X direction is connected to the stem portion 531, and the other end in the X direction is connected to the stem portion 532.

The connecting portion 534 extends in the X direction at the second end portion in the Y direction of the vibration plate 41 (right end portion as viewed in FIG. 9). The connecting portion 534 is connected to the second end in the Y direction (right end as viewed in FIG. 9) of the stem portion 531. The connecting portion 535 extends in the X direction at the first end portion in the Y direction of the vibration plate 41 (left end portion as viewed in FIG. 9). The connecting portion 535 is connected to the first end in the Y direction (left end as viewed in FIG. 9) of the stem portion 532.

As depicted in FIGS. 10A and 10B, the connecting portions 534, 535 are in conduction with the portions 562 of the connecting electrodes 56A, 56B via through-holes 42y formed through the first piezoelectric layer 42 respectively. The portions 562 of the connecting electrodes 56A, 56B are in conduction with the first surface electrodes 54a, 54b as well as COF (not shown) via through-holes 43y formed through the second piezoelectric layer 43 as described above. Therefore, the connecting portions 534, 535 are in conduction with the first surface electrodes 54a, 54b as well as COF via the portions 562 of the connecting electrodes 56A, 56B.

Connecting electrodes 57A, 57B and a plurality of non-conductive electrodes 66 are arranged on the upper surface of the vibration plate 41 (surface between the vibration plate 41 and the first piezoelectric layer 42) in addition to the low electric potential electrode 53.

Each of the connecting electrodes 57A, 57B has an L-shaped form, having a portion 571 which extends in the Y direction and a portion 572 which extends in the X direction. The connecting electrode 57A is arranged at a corner portion which is disposed on the first side in the X direction of the vibration plate 41 (upper side as viewed in FIG. 9) and which is disposed on the first side in the Y direction (left side as viewed in FIG. 9). The connecting electrode 57B is arranged at a corner portion which is disposed on the second side in the X direction of the vibration plate 41 (lower side as viewed in FIG. 9) and which is disposed on the second side in the Y direction (right side as viewed in FIG. 9).

As depicted in FIGS. 10A and 10B, portions 572 of the connecting electrodes 57A, 57B are in conduction with the connecting portions 524, 525 of the high electric potential electrode 52 via through-holes 42x formed through the first piezoelectric layer 42 respectively. As described above, the connecting portions 524, 525 of the high electric potential electrode 52 are in conduction with the second surface electrodes 55a, 55b via the through-holes 43x formed through the second piezoelectric layer 43. Therefore, the connecting electrodes 57A, 57B are in conduction with the second surface electrodes 55a, 55b via the connecting portions 524, 525 of the high electric potential electrode 52.

The portion 571 of the connecting electrode 57A is overlapped in the X direction with the first and second branch portions 533 as counted from the left as viewed in FIG. 9, and is overlapped in the X direction with the five arrays disposed on the left side as viewed in FIG. 6 of the plurality of driving electrode arrays 51R. The portion 571 of the connecting electrode 57B is overlapped in the X direction with the first to third branch portions 533 as counted from the right as viewed in FIG. 9, and is overlapped in the X direction with the seven arrays disposed on the right side as viewed in FIG. 6 of the plurality of driving electrode arrays 51R.

The portion 571 of the connecting electrode 57A is overlapped in the Z direction with the stem portion 521 of the high electric potential electrode 52 (see FIG. 8). The portion 571 of the connecting electrode 57B is overlapped in the Z direction with the stem portion 522 of the high electric potential electrode 52 (see FIG. 8).

The plurality of non-conductive electrodes 66 are arranged between the connecting portion 534 and the portion 572 of the connecting electrode 57B and between the connecting portion 535 and the portion 572 of the connecting electrode 57A, and they are aligned in the X direction. The plurality of non-conductive electrodes 65 are provided individually with respect to the plurality of non-conductive electrodes 64, and they are overlapped in the Z direction with the corresponding non-conductive electrodes 64. The non-conductive electrodes 66 are the electrodes which have the same sizes and the same shapes as those of the non-conductive electrodes 64.

The non-conductive electrodes 66 are not in conduction with any one of the individual electrode 51, the high electric potential electrode 52, and the low electric potential electrode 53, and no electric potential is applied to the non-conductive electrodes 66.

Further, the thicknesses of the respective electrodes described above arranged on the surface between the vibration plate 41 and the first piezoelectric layer 42, the surface between the first piezoelectric layer 42 and the second piezoelectric layer 43, and the upper surface of the second piezoelectric layer 43 are, for example, about 0.5 to 1.5 μm.

<Actuator Unit>

In the piezoelectric actuator 22, as depicted in FIG. 5, the portion of the second piezoelectric layer 43, which is interposed between the individual electrode 51 and the individual portion 52a of the high electric potential electrode 52 in the Z direction, is the first active portion 91 which is mainly polarized in the upward direction. Further, the portions of the first piezoelectric layer 42 and the second piezoelectric layer 43, which are interposed between the individual electrode 51 and the individual portions 53a of the low electric potential electrode 53 in the Z direction, are the second active portions 92 which are mainly polarized in the downward direction. The piezoelectric actuator 22 has the actuator unit 90 which is configured for each of the pressure chambers 10 by the one first active portion 91 and the two second active portions 92 between which the first active portion 91 is interposed in the X direction.

An explanation will now be made about the action of the actuator unit 90 corresponding to the certain nozzle 15 when the ink is discharged from the certain nozzle 15.

Figure 11A:
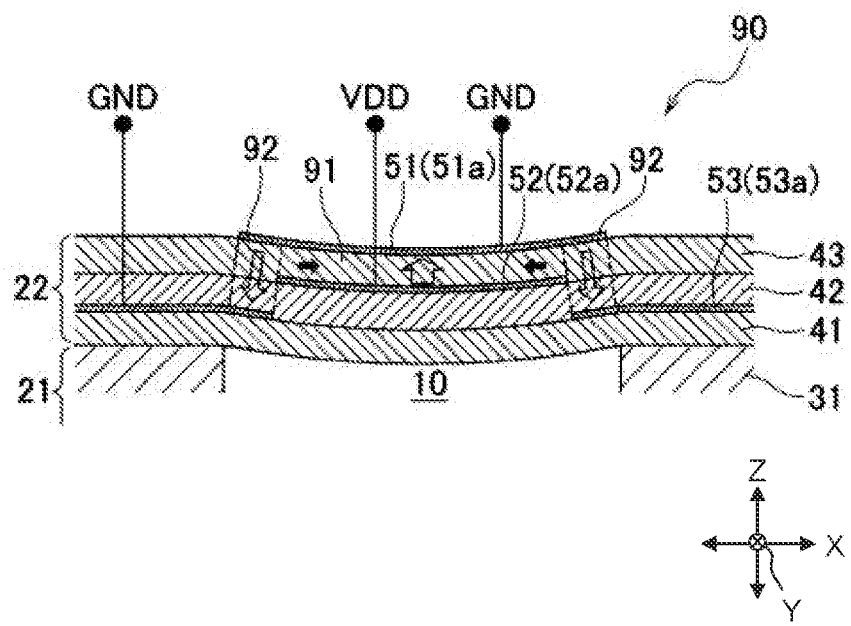
FIG. 11A depicts a state of an actuator unit 90 as viewed in the cross section shown in FIG. 5 when a low electric potential (GND electric potential) is applied to an individual electrode 51.

As depicted in FIG. 11A, the low electric potential (GND electric potential) is applied to each of the individual electrodes 51 before the ink is discharged from the nozzle 15 of the head 3. In this situation, the electric field, which is directed in the upward direction that is equal to the polarization direction, is generated in the first active portion 91 by means of the difference in the electric potential between the individual electrode 51 and the high electric potential electrode 52. The first active portion 91 is shrunk in the in-plane direction (direction directed in the X direction and the Y direction). Accordingly, the portions of the vibration plate 41, the first piezoelectric layer 42, and the second piezoelectric layer 43, which are overlapped in the Z direction with the pressure chamber 10, are flexibly bent or warped so that the portions protrude toward the pressure chamber 10 (downwardly). In this situation, the pressure chamber 10 has a small volume as compared with a situation in which the first piezoelectric layer 42 and the second piezoelectric layer 43 are flat.

Figure 11B:
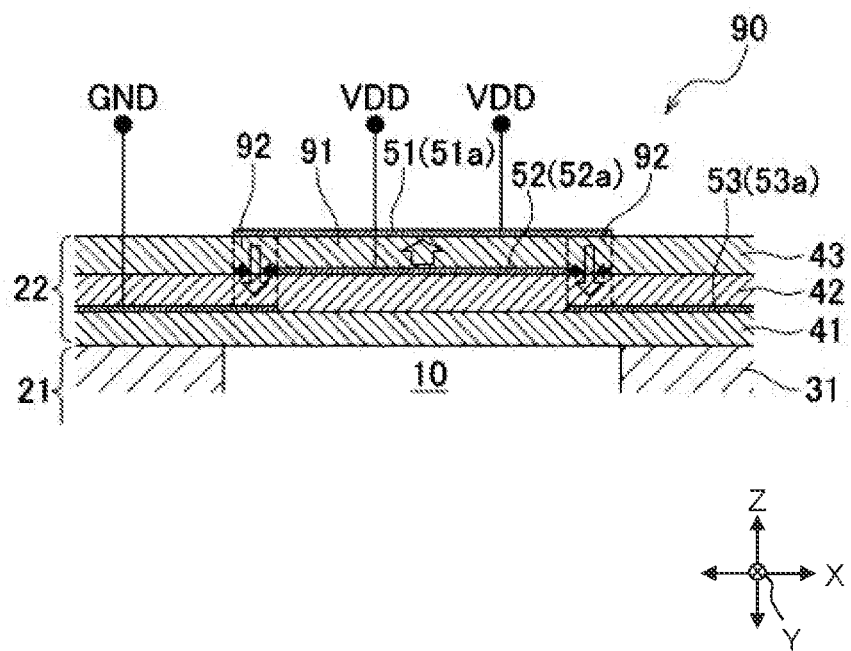
FIG. 11B depicts a state of the actuator unit 90 as viewed in the cross section shown in FIG. 5 when a high electric potential (VDD electric potential) is applied to the individual electrode 51.

When the ink is discharged from a certain nozzle 15, at first, as depicted in FIG. 11B, the electric potential of the individual electrode 51 corresponding to the certain nozzle 15 is switched from the low electric potential (GND electric potential) to the high electric potential (VDD electric potential). In this situation, the difference in the electric potential disappears between the individual electrode 51 and the high electric potential electrode 52, and thus the shrinkage of the first active portion 91 is canceled. On the other hand, when the difference in the electric potential appears between the individual electrode 51 and the low electric potential electrode 53, then the electric field, which is directed in the downward direction that is equal to the polarization direction thereof, is generated thereby in the second active portion 92, and the second active portion 92 is shrunk in the in-plane direction. However, the second active portion 92 is provided in order to suppress the crosstalk (such a phenomenon that the pressure fluctuation, which is accompanied by the deformation of the actuator unit 90 concerning a certain pressure chamber 10, is transmitted to another pressure chamber 10 adjacent in the X direction to the concerning pressure chamber 10). The second active portion 92 scarcely contributes to the deformation of the actuator unit 90. In other words, in this situation, the first piezoelectric layer 42 and the second piezoelectric layer 43 are in the flat state while they are not warped or flexibly bent such that the portion, which is overlapped in the Z direction with the pressure chamber 10, protrudes in the direction (in the upward direction) to make separation from the pressure chamber 10. Accordingly, the volume of the pressure chamber 10 is increased as compared with the state depicted in FIG. 11A.

After that, as depicted in FIG. 11A, the electric potential of the individual electrode 51 corresponding to the nozzle 15 is switched from the high electric potential (VDD electric potential) to the low electric potential (GND electric potential). Then, in the same manner as described above, the portions of the first piezoelectric layer 42 and the second piezoelectric layer 43, which are overlapped in the Z direction with the pressure chamber 10, are warped or flexibly bent such that the portions protrude toward the pressure chamber 10 (in the downward direction). In this situation, the large pressure is applied to the ink contained in the pressure chamber 10 by greatly decreasing the volume of the pressure chamber 10, and the ink is discharged from the nozzle 15.

<Inspection of Piezoelectric Actuator 22>

Next, an explanation will be made about an inspection method for the piezoelectric actuator 22.

The piezoelectric actuator 22 can be produced or manufactured, for example, by calcining (burning) a stack formed by stacking sheets of the piezoelectric material to serve as the vibration plate 41, the first piezoelectric layer 42, and the second piezoelectric layer 43 on which the electrodes are formed on the surface by means of the screen printing.

When the heating is performed during the calcination of the stack, any warpage occurs in some cases in the piezoelectric actuator 22 due to the difference in the coefficient of linear expansion between the piezoelectric material for constructing the vibration plate 41, the first piezoelectric layer 42, and the second piezoelectric layer 43 and the metal material for constructing the electrodes.

In this case, as for the central portion of the piezoelectric actuator 22, the other portions of the piezoelectric actuator 22 exist at the whole circumference therearound, and hence any warpage is suppressed for the central portion by the other portions. On the contrary, as for the end portion of the piezoelectric actuator 22, any other portion of the piezoelectric actuator 22 does not exist on the outer side therefrom, and hence the warpage is hardly suppressed by the other portion. Further, the atmosphere (for example, the temperature) differs between the central portion and the end portion of the piezoelectric actuator 22 during the calcination of the piezoelectric actuator. In view of the above, the warpage easily occurs at the end portion of the piezoelectric actuator 22 as compared with the central portion of the piezoelectric actuator 22. Further, in this embodiment, as for the vibration plate 41, the first piezoelectric layer 42, and the second piezoelectric layer 43, the length Ly in the Y direction is shorter than the length Lx in the X direction. On this account, the warpage occurs especially easily at the end portion in the Y direction of the piezoelectric actuator 22.

If the head 3 is manufactured by using the piezoelectric actuator 22 in which the warpage is large at the end portion in the Y direction, it is feared that any crack may be generated in the vibration plate 41, the first piezoelectric layer 42, and the second piezoelectric layer 43 by the force which is applied to the end portion in the Y direction of the piezoelectric actuator 22 when the piezoelectric actuator 22 is joined to the channel unit 21 and/or when COF is joined to the piezoelectric actuator 22. Further, it is feared that the discharge characteristic may differ for the ink to be discharged from the nozzle 15 between the central portion and the end portion in the Y direction in relation to the manufactured head 3.

In view of the above, in this embodiment, the inspection is performed for the piezoelectric actuator 22 as explained below after manufacturing the piezoelectric actuator 22, and thus the degree of the warpage is grasped at the end portion in the Y direction of the piezoelectric actuator 22. Based on the obtained result, it is judged whether the piezoelectric actuator 22 is normal or abnormal.

Figure 12:
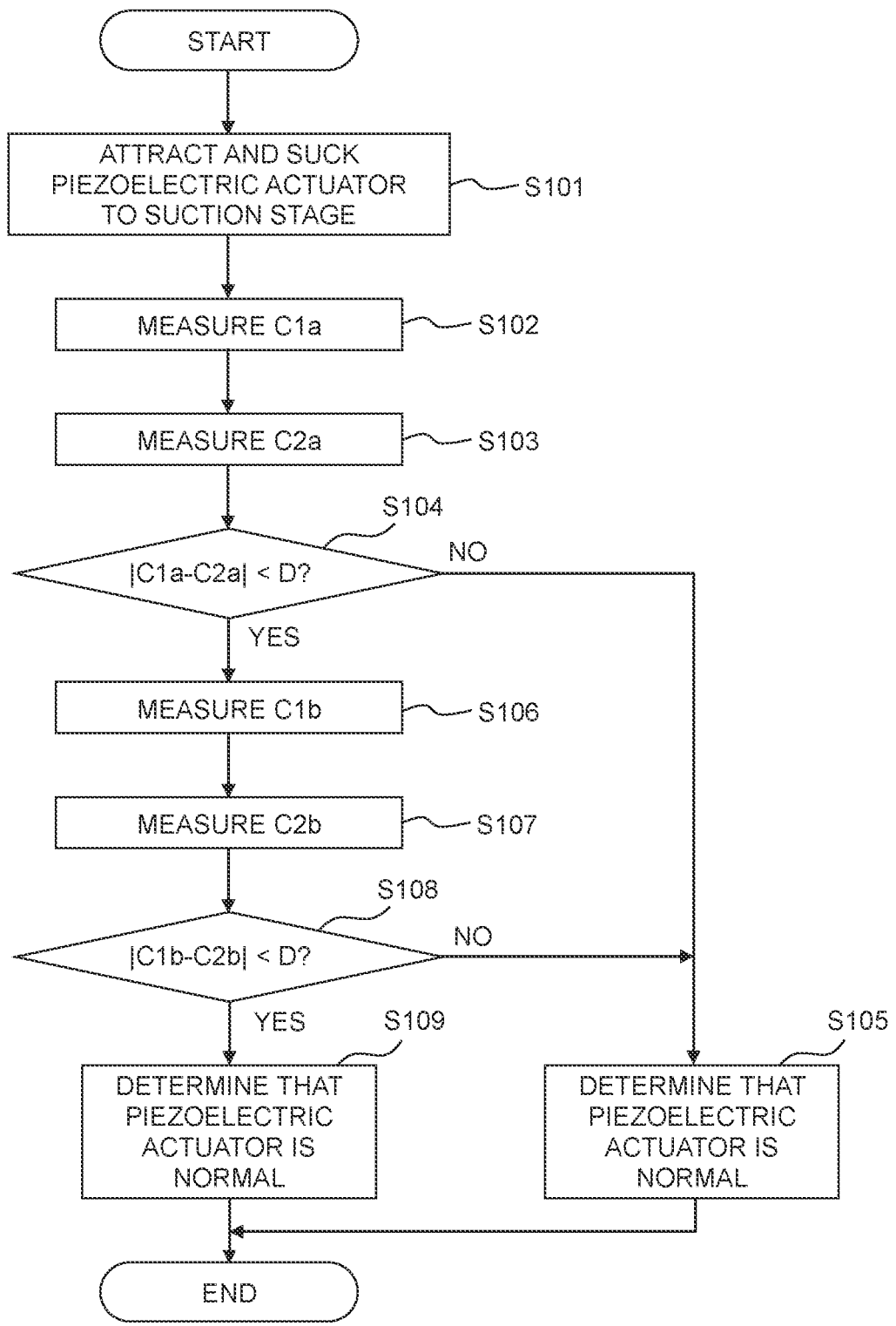
FIG. 12 depicts a flow chart illustrating a procedure of the inspection for the piezoelectric actuator.

When the inspection is performed for the piezoelectric actuator 22, as depicted in FIG. 12, the manufactured piezoelectric actuator 22 is firstly attracted and sucked to a suction stage 101 (see FIGS. 14A to 14D, an example of "base member" of the present invention) (S101).

A large number of suction holes, which are connected to a negative pressure pump (not shown), are formed on a placing surface of the suction stage 101 on which the piezoelectric actuator 22 is placed. The piezoelectric actuator 22, which is placed on the suction stage 101, is sucked by the large number of suction holes, and thus the piezoelectric actuator 22 is sucked to the suction stage 101. Note that the suction force, which is exerted by the suction holes, is not so large. When the end portion in the Y direction of the piezoelectric actuator 22 has the warpage, even if the piezoelectric actuator 22 is sucked by the suction holes, then the warpage of the piezoelectric actuator 22 is not reformed to bring about a flat state, as indicated by alternate long and short dash lines in FIGS. 14A to 14D.

Figure 13A:
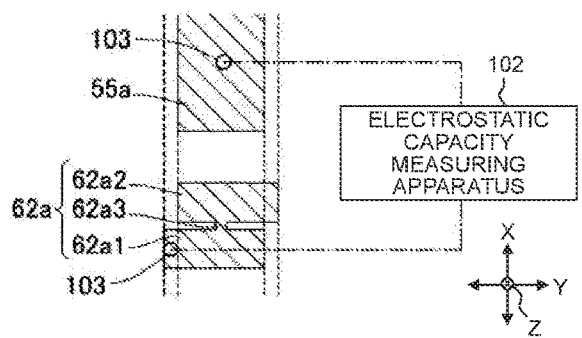
FIG. 13A explains the way of application of two probes 103 when a first electrostatic capacity C1a is measured, FIG. 13B explains the way of application of the two probes 103 when a second electrostatic capacity C2a is measured, FIG. 13C explains the way of application of the two probes 103 when a first electrostatic capacity C1b is measured, and FIG. 13D explains the way of application of the two probes 103 when a second electrostatic capacity C2b is measured.
Figure 14A:
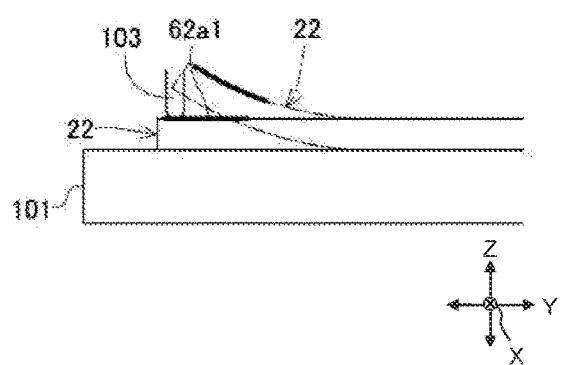
FIG. 14A depicts the piezoelectric actuator 22 arranged on a suction stage 101 as viewed in the X direction in the state shown in FIG. 13A.

Subsequently, the first electrostatic capacity C1$a$ is measured as the electrostatic capacity between the inspection electrode 62$a$ and the high electric potential electrode 52 (S102). This process will be explained in more detail below. In S102, as depicted in FIGS. 13A and 14A, two probes 103, which are connected to an electrostatic capacity measuring apparatus 102, are applied to the end portion on the first side in the Y direction of the electrode portion 62$a$1 as the portion of the inspection electrode 62$a$ disposed on the first side in the Y direction of any other portion of the inspection electrode 62$a$ (leftmost portion as viewed in FIG. 7A) and the second surface electrode 55$a$. Further, the probe 103, which is applied to the end portion on the first side in the Y direction of the electrode portion 62$a$1, is pressed against the suction stage 101. In this state, as indicated by solid lines in FIG. 14A, the situation approaches the flat state while the warpage is reformed at the portion in the Y direction of the piezoelectric actuator 22 at which the end portion on the first side in the Y direction of the electrode portion 62$a$1 against which the probe 103 is pressed is arranged and the portion which is disposed on the inner side therefrom. Then, in this state, the first electrostatic capacity C1$a$ is measured by means of the electrostatic capacity measuring apparatus 102.

Figure 13B:
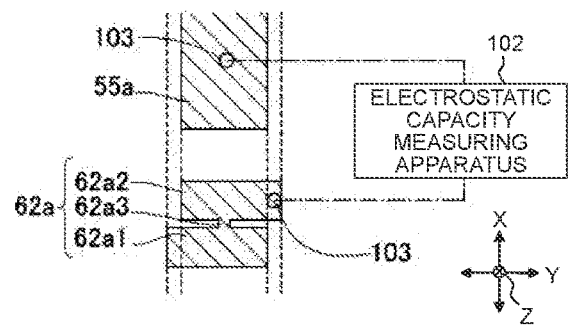
Figure 14B:
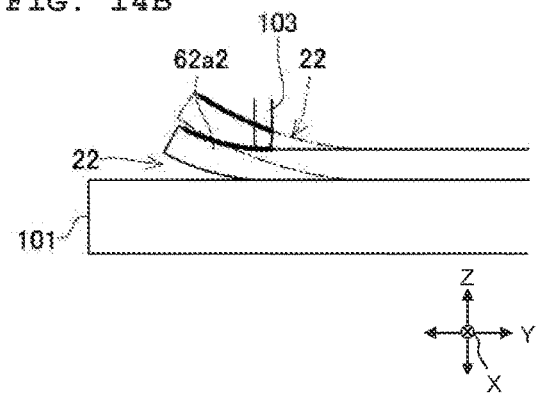
FIG. 14B depicts the piezoelectric actuator 22 arranged on the suction stage 101 as viewed in the X direction in the state shown in FIG. 13B.

Subsequently, the second electrostatic capacity C2$a$ is measured as the electrostatic capacity between the inspection electrode 62$a$ and the high electric potential electrode 52 (S103). This process will be explained in more detail below. In S103, as depicted in FIGS. 13B and 14B, the two probes 103 are applied to the end portion on the second side in the Y direction of the electrode portion 62$a$2 as the portion of the inspection electrode 62$a$ disposed on the second side in the Y direction of any other portion of the inspection electrode 62$a$ (rightmost portion as viewed in FIG. 7A) and the second surface electrode 55$a$. Further, the probe 103, which is applied to the end portion on the second side in the Y direction of the electrode portion 62a2, is pressed against the suction stage 101. In this state, as indicated by solid lines in FIG. 14B, the situation approaches the flat state while the warpage is reformed at the portion in the Y direction of the piezoelectric actuator 22 at which the end portion on the second side in the Y direction of the electrode portion 62a2 against which the probe 103 is pressed is arranged and the portion which is disposed on the inner side therefrom. In this situation, in the Y direction, the end on the second side of the electrode portion 62a2 is positioned on the inner side of the piezoelectric actuator 22 as compared with the end on the first side of the electrode portion 62a1. Therefore, the degree of the reform of the warpage of the piezoelectric actuator 22 in S103 is smaller than the degree of the reform of the warpage of the piezoelectric actuator 22 in S102. Then, in this state, the second electrostatic capacity C2a is measured by the electrostatic capacity measuring apparatus 102.

Subsequently, it is judged (determined) whether or not the absolute value |C1a−C2a| of the difference between the measured first electrostatic capacity C1a and the second electrostatic capacity C2a is less than a predetermined value D (S104). If the absolute value |C1a−C2a| is not less than the predetermined value D (S104: NO), it is judged that the piezoelectric actuator 22 is abnormal (S105).

If the absolute value |C1a−C2a| is less than the predetermined value D (S104: YES), the first electrostatic capacity C1b is subsequently measured as the electrostatic capacity between the inspection electrode 62b and the high electric potential electrode 52 (S106).

Figure 13C:
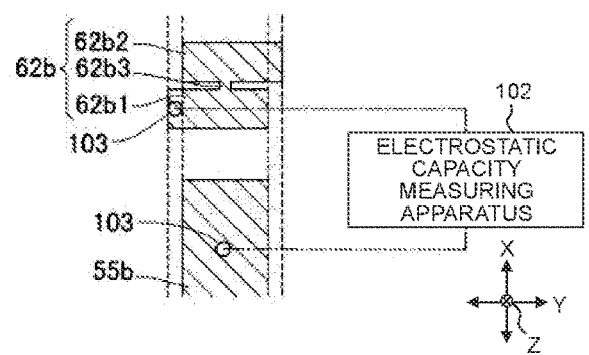
Figure 14C:
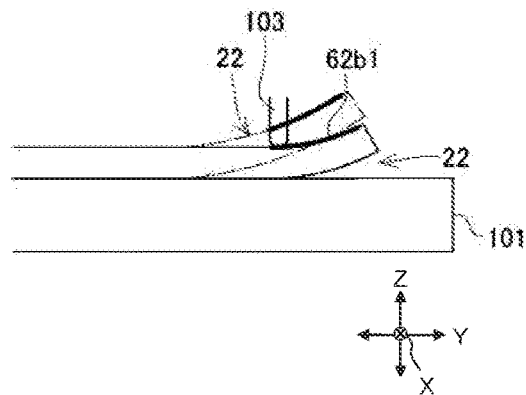
FIG. 14C depicts the piezoelectric actuator 22 arranged on the suction stage 101 as viewed in the X direction in the state shown in FIG. 13C.

This process will be explained in more detail below. In S106, as depicted in FIGS. 13C and 14C, the two probes 103 are applied to the end portion on the first side in the Y direction of the electrode portion 62b1 as the portion of the inspection electrode 62b disposed on the first side in the Y direction of any other portion of the inspection electrode 62b (leftmost portion as viewed in FIG. 7B) and the second surface electrode 55b. Further, the probe 103, which is applied to the end portion on the first side in the Y direction of the electrode portion 62b1, is pressed against the suction stage 101. In this state, as indicated by solid lines in FIG. 14C, the situation approaches the flat state while the warpage is reformed at the portion in the Y direction of the piezoelectric actuator 22 at which the end portion on the first side in the Y direction of the electrode portion 62b1 against which the probe 103 is pressed is arranged and the portion which is disposed on the inner side therefrom. Then, in this state, the first electrostatic capacity C1b is measured by the electrostatic capacity measuring apparatus 102.

Figure 13D:
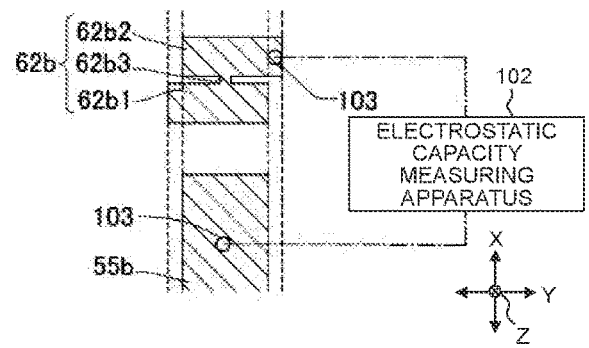
Figure 14D:
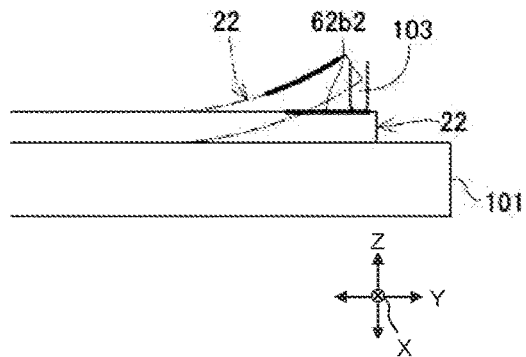
FIG. 14D depicts the piezoelectric actuator 22 arranged on the suction stage 101 as viewed in the X direction in the state shown in FIG. 13D.

Subsequently, the second electrostatic capacity C2b is measured as the electrostatic capacity between the inspection electrode 62b and the high electric potential electrode 52 (S107). This process will be explained in more detail below. In S107, as depicted in FIGS. 13D and 14D, the two probes 103 are applied to the end portion on the second side in the Y direction of the electrode portion 62b2 as the portion of the inspection electrode 62b disposed on the second side in the Y direction of any other portion of the inspection electrode 62b (rightmost portion as viewed in FIG. 7B) and the second surface electrode 55b. Further, the probe 103, which is applied to the end portion on the second side in the Y direction of the electrode portion 62b2, is pressed against the suction stage 101. In this state, as indicated by solid lines in FIG. 14D, the situation approaches the flat state while the warpage is reformed at the portion in the Y direction of the piezoelectric actuator 22 at which the end portion on the second side in the Y direction of the electrode portion 62b2 against which the probe 103 is pressed is arranged and the portion which is disposed on the inner side therefrom. In this situation, in the Y direction, the end on the second side of the electrode portion 62b2 is positioned on the outer side of the piezoelectric actuator 22 as compared with the end on the first side of the electrode portion 62b1. Therefore, the degree of the reform of the warpage of the piezoelectric actuator 22 in S107 is larger than the degree of the reform of the warpage of the piezoelectric actuator 22 in S106. Then, in this state, the second electrostatic capacity C2b is measured by the electrostatic capacity measuring apparatus 102.

Subsequently, it is judged whether or not the absolute value |C1b−C2b| of the difference between the measured first electrostatic capacity C1b and the second electrostatic capacity C2b is less than the predetermined value D (S108). If the absolute value |C1b−C2b| is not less than the predetermined value D (S108: NO), it is judged that the piezoelectric actuator 22 is abnormal (S105). If the absolute value |C1b−C2b| is less than the predetermined value D (S108: YES), it is judged that the piezoelectric actuator 22 is normal (S109).

<Effects>

In the embodiment described above, the second surface electrodes 55a, 55b which are in conduction with the high electric potential electrode 52 and the inspection electrodes 62a, 62b which are overlapped in the Z direction with the connecting portions 524, 525 of the high electric potential electrode 52 are arranged at the end portions in the Y direction of the upper surface of the second piezoelectric layer 43. Therefore, the two probes 103, which are connected to the electrostatic capacity measuring apparatus 102, are applied to the inspection electrode 62a and the second surface electrode 55a and the inspection electrode 62b and the second surface electrode 55b respectively to measure the electrostatic capacity between the inspection electrode 62a and the high electric potential electrode 52 and the electrostatic capacity between the inspection electrode 62b and the high electric potential electrode 52. It is possible to grasp the degree of the warpage at the end portion in the Y direction of the piezoelectric actuator 22 on the basis of the measured electrostatic capacities.

In particular, the two probes 103 are applied to the end portion on the first side in the Y direction of the inspection electrode 62a and the second surface electrode 55a, and the probe 103, which is applied to the portion of the inspection electrode 62a, is pressed against the suction stage 101. In this state, the first electrostatic capacity C1a is measured. Further, the two probes 103 are applied to the end portion on the second side in the Y direction of the inspection electrode 62a and the second surface electrode 55a, and the probe 103, which is applied to the portion of the inspection electrode 62a, is pressed against the suction stage 101. In this state, the second electrostatic capacity C2a is measured.

Similarly, the two probes 103 are applied to the end portion on the first side in the Y direction of the inspection electrode 62b and the second surface electrode 55b, and the probe 103, which is applied to the portion of the inspection electrode 62b, is pressed against the suction stage 101. In this state, the first electrostatic capacity C1b is measured. Further, the two probes 103 are applied to the end portion on the second side in the Y direction of the inspection electrode 62b and the second surface electrode 55b, and the probe 103, which is applied to the portion of the inspection electrode 62b, is pressed against the suction stage 101. In this state, the second electrostatic capacity C2b is measured.

In this case, when the warpage is generated at the end portion in the Y direction of the piezoelectric actuator 22, the following situation occurs. That is, the more greatly the portion disposed on the more outer side in the Y direction of the piezoelectric actuator 22 is pressed against the suction stage 101, the more greatly the warpage is reformed to approach the flat state.

Therefore, the larger the warpages at the end portions in the Y direction of the piezoelectric actuator 22 are, the larger the absolute value |C1a−C2a| of the difference between the first electrostatic capacity C1a and the second electrostatic capacity C2a and the absolute value |C1b−C2b| of the difference between the first electrostatic capacity C1b and the second electrostatic capacity C2b are. In view of the above, in this embodiment, the degree of the warpage at the end portion in the Y direction of the piezoelectric actuator 22 is grasped on the basis of whether or not the absolute value |C1a−C2a| and the absolute value |C1b−C2b| are less than the predetermined value D. Thus, it is possible to judge whether or not the piezoelectric actuator 22 is normal.

Further, in this embodiment, the length Ly in the Y direction of the piezoelectric actuator 22 is shorter than the length Lx in the X direction. Therefore, any warpage easily appears at the end portion in the Y direction of the piezoelectric actuator 22 due to the heating during the manufacturing.

In view of the above, in this embodiment, the inspection electrodes 62a, 62b and the second surface electrodes 55a, 55b are arranged at the end portions in the Y direction of the upper surface of the second piezoelectric layer 43. Therefore, it is possible to grasp the degree of the warpage at the end portion in the Y direction of the piezoelectric actuator 22 at which the warpage easily appears.

Further, unlike this embodiment, the inspection electrode may be arranged so that the inspection electrode is overlapped in the Z direction with the low electric potential electrode 53. The two probes 103 may be applied to the inspection electrode and the first surface electrode 54a, 54b which is in conduction with the low electric potential electrode 53 to measure the electrostatic capacity between the inspection electrode and the low electric potential electrode 53. In this way, it is also possible to grasp the degree of the warpage at the end portion in the Y direction of the piezoelectric actuator 22 in the same manner as described above.

However, in this case, the distance between the inspection electrode and the low electric potential electrode 53 is larger than the distance between the inspection electrode 62a, 62b and the high electric potential electrode 52 in the case of this embodiment. Therefore, the measured electrostatic capacity is decreased. The change of the measured electrostatic capacity is decreased as well with respect to the warpage at the end portion in the Y direction of the piezoelectric actuator 22.

In view of the above, in this embodiment, as described above, the inspection electrode 62a, 62b is arranged so that the inspection electrode 62a, 62b is overlapped in the Z direction with the high electric potential electrode 52. The degree of the warpage at the end portion in the Y direction of the piezoelectric actuator 22 is grasped on the basis of the electrostatic capacity between the inspection electrode 62a, 62b and the high electric potential electrode 52. Accordingly, the change of the measured electrostatic capacity is large with respect to the degree of the warpage at the end portion in the Y direction of the piezoelectric actuator 22. It is easy to grasp the degree of the warpage at the end portion in the Y direction of the piezoelectric actuator.

Further, in this embodiment, the first surface electrode 54a and the second surface electrode 55a are arranged while providing the space in the X direction, while the inspection electrode 62a is arranged between the first surface electrode 54a and the second surface electrode 55a. Further, the first surface electrode 54b and the second surface electrode 55b are arranged while providing the space in the X direction, while the inspection electrode 62b is arranged between the first surface electrode 54b and the second surface electrode 55b. Accordingly, the rigidity can be raised at the end portion in the Y direction of the piezoelectric actuator 22 as compared with a case in which the inspection electrodes 62a, 62b are not arranged at the foregoing positions. The warpage can be suppressed at the end portion in the Y direction of the piezoelectric actuator 22.

Further, in this embodiment, the inspection electrode 62a and the plurality of non-conductive electrodes 63a are arranged while being aligned in the X direction between the first surface electrode 54a and the second surface electrode 55a. Further, the inspection electrode 62b and the plurality of non-conductive electrodes 63b are arranged while being aligned in the X direction between the first surface electrode 54b and the second surface electrode 55b. Accordingly, the rigidity can be further raised at the end portion in the Y direction of the piezoelectric actuator 22. The warpage can be more sufficiently suppressed at the end portion in the Y direction of the piezoelectric actuator 22.

Further, in this embodiment, the connecting portion 524 extends in the X direction to the position at which the connecting portion 524 is overlapped in the Z direction with the second surface electrode 55a and the connecting portion 524 is overlapped in the Z direction with the inspection electrode 62a. On the other hand, the inspection electrode 62a is arranged between the second surface electrode 55a and the non-conductive electrode 63a disposed most closely to the second surface electrode 55a. Accordingly, the length in the X direction of the connecting portion 524 allowed to extend in the X direction can be made as short as possible. Similarly, in this embodiment, the connecting portion 525 extends in the X direction to the position at which the connecting portion 525 is overlapped in the Z direction with the second surface electrode 55b and the connecting portion 525 is overlapped in the Z direction with the inspection electrode 62b. On the other hand, the inspection electrode 62b is arranged between the second surface electrode 55b and the non-conductive electrode 63b disposed most closely to the second surface electrode 55b. Accordingly, the length in the X direction of the connecting portion 525 allowed to extend in the X direction can be made as short as possible.

If an electrode, which has a long length in the X direction, is present at the end portion in the Y direction of the piezoelectric actuator 22, the warpage is easily generated at the end portion in the Y direction of the piezoelectric actuator 22. However, owing to the lengths in the X direction of the connecting portions 524, 525 which can be made short as described above, the warpage can be suppressed at the end portion in the Y direction of the piezoelectric actuator 22.

Further, when the portion of the inspection electrode 62a, to which the probe 103 is applied when the first electrostatic capacity C1a is measured, is separated in the Y direction farther from the portion to which the probe 103 is applied when the second electrostatic capacity C2a is measured, the difference in the degree of the reform of the warpage of the piezoelectric actuator 22 is more increased when the probe 103, which is applied to the inspection electrode 62a, is pressed against the suction stage 101. As a result, the absolute value |C1a−C2a| of the difference between the first electrostatic capacity C1a and the second electrostatic capacity C2a is increased with respect to the warpage at the end portion in the Y direction of the piezoelectric actuator 22.

Similarly, when the portion of the inspection electrode 62b, to which the probe 103 is applied when the first electrostatic capacity C1b is measured, is separated in the Y direction farther from the portion to which the probe 103 is applied when the second electrostatic capacity C2b is measured, the difference in the degree of the reform of the warpage of the piezoelectric actuator 22 is more increased when the probe 103, which is applied to the inspection electrode 62b, is pressed against the suction stage 101. As a result, the absolute value |C1b–C2b| of the difference between the first electrostatic capacity C1b and the second electrostatic capacity C2b is increased with respect to the warpage at the end portion in the Y direction of the piezoelectric actuator 22.

Then, in this embodiment, the length W1a between the end on the first side and the end on the second side in the Y direction of the inspection electrode 62a (length between the end on the first side of the electrode portion 62a1 and the end on the second side of the electrode portion 62a2) is longer than the length W1b in the Y direction of the non-conductive electrode 63a. Further, the length W2a between the end on the first side and the end on the second side in the Y direction of the inspection electrode 62b (length between the end on the first side of the electrode portion 62b1 and the end on the second side of the electrode portion 62b2) is longer than the length W2b in the Y direction of the non-conductive electrode 63b. Accordingly, the absolute value |C1a–C2a|, |C1b–C2b| of the difference in the electrostatic capacity is increased with respect to the warpage of the piezoelectric actuator 22. It is easy to grasp the degree of the warpage of the piezoelectric actuator.

Further, in this embodiment, the shape, which is obtained by projecting the inspection electrode 62a in the Z direction, has the two oblong electrode portions 62a1, 62a2 in which the Y direction is the longitudinal direction, and the shape, which is obtained by projecting the inspection electrode 62b in the Z direction, has the two oblong electrode portions 62b1, 62b2 in which the Y direction is the longitudinal direction. Thus, it is possible to secure the areas (square measures) of the inspection electrodes 62a, 62b. Further, the force, which is generated by the difference in the coefficient of linear expansion between the inspection electrode 62a, 62b and the second piezoelectric layer 43 and which intends to generate the warpage in the piezoelectric actuator 22, is maximized at the central portion of the inspection electrode 62a, 62b in the Y direction. In relation thereto, in this embodiment, the electrode portion 62a1 and the electrode portion 62a2 are arranged while being deviated from each other in the Y direction in the inspection electrode 62a, and the electrode portion 62b1 and the electrode portion 62b2 are arranged while being deviated from each other in the Y direction in the inspection electrode 62b. Therefore, the portion, at which the force generated by the difference in the coefficient of linear expansion between the electrode portion 62a1 and the second piezoelectric layer 43 to intend the generation of the warpage in the piezoelectric actuator 22 is maximized, can be deviated in the Y direction from the portion at which the force generated by the difference in the coefficient of linear expansion between the electrode portion 62a2 and the second piezoelectric layer 43 to intend the generation of the warpage in the piezoelectric actuator 22 is maximized. Further, the portion, at which the force generated by the difference in the coefficient of linear expansion between the electrode portion 62b1 and the second piezoelectric layer 43 to intend the generation of the warpage in the piezoelectric actuator 22 is maximized, can be deviated in the Y direction from the portion at which the force generated by the difference in the coefficient of linear expansion between the electrode portion 62b2 and the second piezoelectric layer 43 to intend the generation of the warpage in the piezoelectric actuator 22 is maximized. According to the fact as described above, the force, which intends to generate the warpage in the piezoelectric actuator 22, is not concentrated on any portion of the piezoelectric actuator 22 having the same position in the Y direction. It is possible to decrease the warpage generated in the piezoelectric actuator 22.

Modified Embodiments

The preferred embodiment of the present disclosure has been explained above. However, the present disclosure is not limited to the embodiment described above. The present disclosure can be variously modified or changed within a scope defined in claims.

The shape of the inspection electrode is not limited to the shape of the embodiment described above.

For example, the positions in the Y direction of the electrode portion 62a1 and the electrode portion 62a2 may be opposite to those of the embodiment described above, and the electrode portion 62a2 may be deviated toward the first side in the Y direction (left side as viewed in FIG. 7A) with respect to the electrode portion 62a1. In this case, the probe 103 is applied to the end portion on the second side in the Y direction of the first electrode portion 62a1 in S102, and the probe 103 is applied to the end portion on the first side in the Y direction of the second electrode portion 62a2 in S103.

Similarly, the positions in the Y direction of the electrode portion 62b1 and the electrode portion 62b2 may be opposite to those of the embodiment described above, and the electrode portion 62b2 may be deviated toward the first side in the Y direction (left side as viewed in FIG. 7A) with respect to the electrode portion 62b1. In this case, the probe 103 is applied to the end portion on the second side in the Y direction of the first electrode portion 62b1 in S107, and the probe 103 is applied to the end portion on the first side in the Y direction of the second electrode portion 62b2 in S106.

Alternatively, it is also allowable that at least one of the electrode portion 62a1 and the electrode portion 62a2 of the inspection electrode 62a and the electrode portion 62b1 and the electrode portion 62b2 of the inspection electrode 62b is not deviated in the Y direction. Note that if the electrode portion 62a1 and the electrode portion 62a2 are not deviated in the Y direction, the probe 103 is applied to the end portion on the first side in the Y direction of any one of the electrode portions 62a1, 62a2 in S102 described above. Further, the probe 103 is applied to the end portion on the second side in the Y direction of any one of the electrode portions 62a1, 62a2 in S103 described above. Further, if the electrode portion 62b1 and the electrode portion 62b2 are not deviated in the Y direction, the probe 103 is applied to the end portion on the first side in the Y direction of any one of the electrode portions 62b1, 62b2 in S106. Further, the probe 103 is applied to the end portion on the second side in the Y direction of any one of the electrode portions 62b1, 62b2 in S107 described above.

Figure 15A:
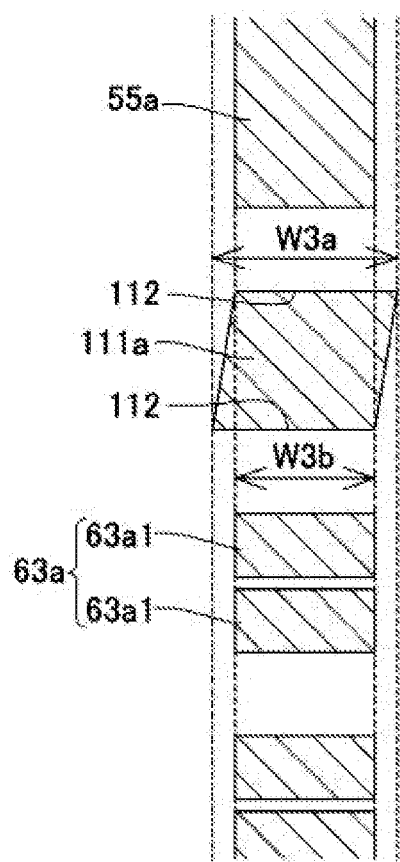
FIG. 15A is a figure corresponding to FIG. 7A.
Figure 15B:
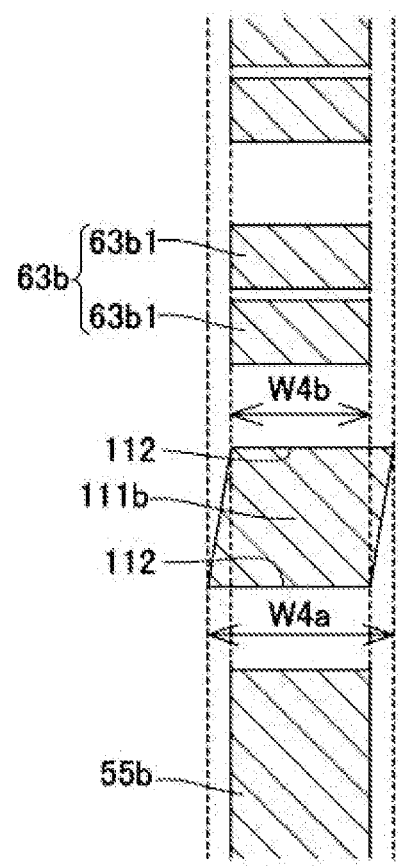
FIG. 15B is a figure corresponding to FIG. 7B.

In a first modified embodiment, as depicted in FIGS. 15A and 15B, shapes of inspection electrodes 111a, 111b, which are obtained by the projection in the Z direction, are parallelograms each of which has a pair of opposing sides 112 that are parallel to the Y direction.

The inspection electrode 111*a* has a corner portion which is disposed on the first side in the Y direction and which is disposed on the second side in the X direction (lower-left corner portion as viewed in FIG. 15A), the corner portion being positioned on the first side in the Y direction of any other portion of the inspection electrode 111*a* (leftmost portion as viewed in FIG. 15A). Then, in the Y direction, the corner portion of the inspection electrode 111*a* is positioned on the first side (left side as viewed in FIG. 15A) as compared with the end on the first side of the non-conductive electrode 63*a* (left end as viewed in FIG. 15A).

Further, the inspection electrode 111*a* has a corner portion which is disposed on the second side in the Y direction and which is disposed on the first side in the X direction (upper-right corner portion as viewed in FIG. 15A), the corner portion being positioned on the second side of any other portion of the inspection electrode 111*a* (rightmost portion as viewed in FIG. 15A). Then, in the Y direction, the corner portion of the inspection electrode 111*a* is positioned on the second side (right side as viewed in FIG. 15A) as compared with the end on the second side of the non-conductive electrode 63*a* (right end as viewed in FIG. 15A).

The inspection electrode 111*b* has a corner portion which is disposed on the first side in the Y direction and which is disposed on the second side in the X direction (lower-left corner portion as viewed in FIG. 15B), the corner portion being positioned on the first side of any other portion of the inspection electrode 111*b* (leftmost portion as viewed in FIG. 15B). Then, in the Y direction, the corner portion of the inspection electrode 111*b* is positioned on the first side (left side as viewed in FIG. 15B) as compared with the end on the first side of the non-conductive electrode 63*b* (left end as viewed in FIG. 15B).

Further, the inspection electrode 111*b* has a corner portion which is disposed on the second side in the Y direction and which is disposed on the first side in the X direction (upper-right corner portion as viewed in FIG. 15B), the corner portion being positioned on the second side of any other portion of the inspection electrode 111*b* (rightmost portion as viewed in FIG. 15B). Then, in the Y direction, the corner portion of the inspection electrode 111*b* is positioned on the second side (right side as viewed in FIG. 15B) as compared with the end on the second side of the non-conductive electrode 63*b* (right end as viewed in FIG. 15B).

Then, in the first modified embodiment, owing to the inspection electrodes 111*a*, 111*b* which have the shapes as described above, the length W3*a*, W4*a* between the end on the first side and the end on the second side in the Y direction of the inspection electrode 111*a*, 111*b* is longer than the length W3*b*, W4*b* in the Y direction of the non-conductive electrode 63*a*, 64*b*.

Then, in the first modified embodiment, the probes 103 are applied to the lower-left corner portions of the inspection electrodes 111*a*, 111*b* depicted in FIGS. 15A and 15B respectively in S102, S106 described above. Further, the probes 103 are applied to the upper-right corner portions of the inspection electrodes 111*a*, 111*b* depicted in FIGS. 15A and 15B respectively in S103, S107 described above.

In the first modified embodiment, the shapes of the inspection electrodes 111*a*, 111*b*, which are obtained by the projection in the Z direction, are the parallelograms each of which has the pair of opposing sides 112 that are parallel to the Y direction. Thus, it is possible to lengthen the length between the end on the first side and the end on the second side in the Y direction of each of the inspection electrodes 111*a*, 111*b*.

Figure 16A:
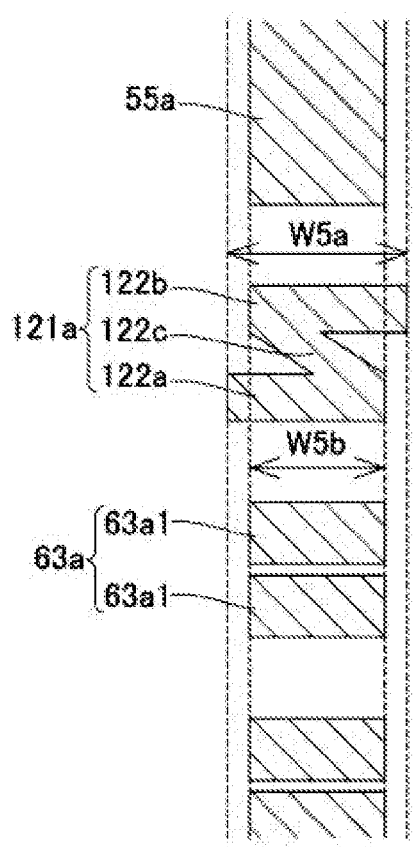
FIG. 16A is a figure corresponding to FIG. 7A.

In a second modified embodiment, as depicted in FIG. 16A, an inspection electrode 121*a* has a first electrode portion 122*a*, a second electrode portion 122*b*, and a third electrode portion 122*c*. The first electrode portion 122*a* extends in the Y direction. Further, in the Y direction, the end on the first side of the first electrode portion 122*a* (left end as viewed in FIG. 16A) is positioned on the first side (left side as viewed in FIG. 16A) as compared with the end on the first side of the non-conductive electrode 63*a* (left end as viewed in FIG. 16A).

The second electrode portion 122*b* extends in the Y direction. Further, in the Y direction, the end on the second side of the second electrode portion 122*b* (right end as viewed in FIG. 16A) is positioned on the second side (right side as viewed in FIG. 16A) as compared with the end on the second side of the non-conductive electrode 63*a* (right end as viewed in FIG. 16A). The third electrode portion 122*c* is positioned between the first electrode portion 122*a* and the second electrode portion 122*b*. The third electrode portion 122*c* connects the end on the second side in the Y direction of the first electrode portion 122*a* (right end as viewed in FIG. 16A) and the end on the first side in the Y direction of the second electrode portion 122*b* (left end as viewed in FIG. 16A).

Figure 16B:
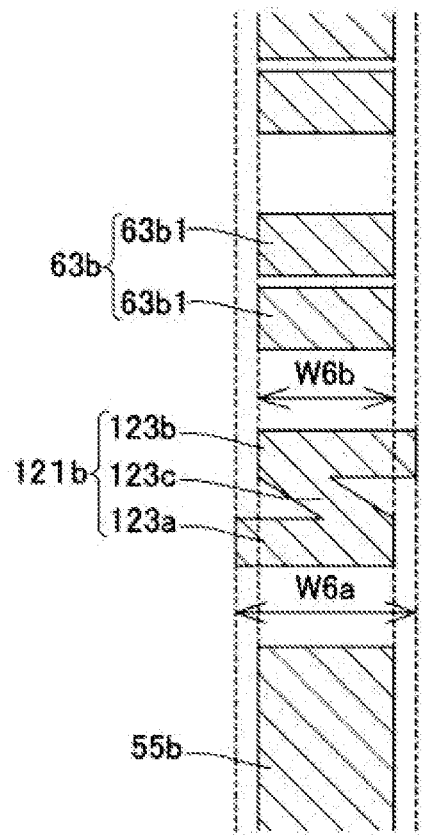
FIG. 16B is a figure corresponding to FIG. 7B.
Figure 16B:
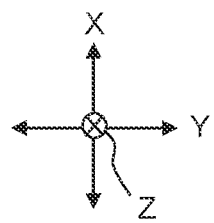
Figure 16B:
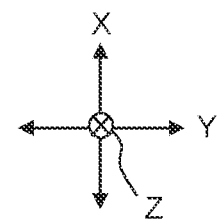

Further, in the second modified embodiment, as depicted in FIG. 16B, an inspection electrode 121*b* has a first electrode portion 123*a*, a second electrode portion 123*b*, and a third electrode portion 123*c*. The first electrode portion 123*a*, the second electrode portion 123*b*, and the third electrode portion 123*c* have the same sizes and the same shapes as those of the first electrode portion 122*a*, the second electrode portion 122*b*, and the third electrode portion 122*c* respectively.

Then, in the second modified embodiment, the inspection electrodes 121*a*. 121*b* are configured as described above. Accordingly, the length W5*a*, W6*a* between the end on the first side and the end on the second side in the Y direction of the inspection electrode 121*a*. 121*b* is longer than the length W5*b*, W6*b* in the Y direction of the non-conductive electrode 63*a*. 63*b*.

Then, in the second modified embodiment, in S102 described above, the probe 103 is applied to the end portion on the first side in the Y direction (left side as viewed in FIG. 16A) of the first electrode portion 122*a* of the inspection electrode 121*a*. Further, in S103 described above, the probe 103 is applied to the end portion on the second side in the Y direction (right side as viewed in FIG. 16A) of the second electrode portion 122*b* of the inspection electrode 121*a*. Further, in S106 described above, the probe 103 is applied to the end portion on the first side in the Y direction (left side as viewed in FIG. 16B) of the first electrode portion 123*a* of the inspection electrode 121*b*. Further, in S107 described above, the probe 103 is applied to the end portion on the second side in the Y direction (right side as viewed in FIG. 16B) of the second electrode portion 123*b* of the inspection electrode 121*b*.

Then, in the second modified embodiment, the inspection electrodes 121*a*, 121*b* have the first to third electrode portions 122*a* to 122*c* and the first to third electrode portions 123*a* to 123*c* respectively as described above. Thus, it is possible to lengthen the length between the end on the first side and the end on the second side in the Y direction of the inspection electrode 121*a*, 121*b*.

Alternatively, the inspection electrode may be configured so that the shape, which is obtained by the projection in the Z direction, is any shape which is distinct from those explained above, such that the length in the Y direction between the end on the first side and the end on the second side in the Y direction may be longer than the length in the Y direction of the non-conductive electrode 63a, 63b.

Further, the inspection electrode is not limited to such configuration that the length in the Y direction between the end on the first side and the end on the second side in the Y direction is longer than the length in the Y direction of the non-conductive electrode 63a. 63b. The length in the Y direction between the end on the first side and the end on the second side in the Y direction of the inspection electrode may be not more than the length in the Y direction of the non-conductive electrode 63a, 63b.

Further, in the embodiment described above, the connecting portion 524, which is overlapped in the Z direction with the second surface electrode 55a, extends to the position at which the connecting portion 524 is overlapped in the Z direction with the inspection electrode 62a. The inspection electrode 62a is arranged between the second surface electrode 55a and the non-conductive electrode 63a which is disposed most closely to the second surface electrode 55a. Further, the connecting portion 525, which is overlapped in the Z direction with the second surface electrode 55b, extends to the position at which the connecting portion 525 is overlapped in the Z direction with the inspection electrode 62b. The inspection electrode 62b is arranged between the second surface electrode 55b and the non-conductive electrode 63b which is disposed most closely to the second surface electrode 55b. However, there is no limitation thereto.

For example, in the configuration in which the connecting portion 524 overlapped in the Z direction with the second surface electrode 55a extends to the position at which the connecting portion 524 is overlapped in the Z direction with the inspection electrode 62a, the inspection electrode 62a may be arranged between the two non-conductive electrodes 63a or between the first surface electrode 54a and the non-conductive electrode 63a which is disposed most closely to the first surface electrode 54a.

Similarly, in the configuration in which the connecting portion 525 overlapped in the Z direction with the second surface electrode 55b extends to the position at which the connecting portion 525 is overlapped in the Z direction with the inspection electrode 62b, the inspection electrode 62b may be arranged between the two non-conductive electrodes 63b or between the first surface electrode 54b and the non-conductive electrode 63b which is disposed most closely to the first surface electrode 54b.

Further, in the embodiment described above, the inspection electrode 62a and the plurality of non-conductive electrodes 63a are aligned in the X direction between the first surface electrode 54a and the second surface electrode 55a. Further, the inspection electrode 62b and the plurality of non-conductive electrodes 63b are aligned in the X direction between the first surface electrode 54b and the second surface electrode 55b. However, there is no limitation thereto.

For example, one non-conductive electrode may be arranged at least at any one of positions included in a position between the first surface electrode 54a and the second surface electrode 55a and a position between the first surface electrode 54b and the second surface electrode 55b. Further, for example, it is also allowable that no non-conductive electrode is arranged at least at any one of positions included in a position between the first surface electrode 54a and the second surface electrode 55a and a position between the first surface electrode 54b and the second surface electrode 55b.

Further, in the embodiment described above, the inspection electrode 62a is arranged between the first surface electrode 54a and the second surface electrode 55a. Further, the inspection electrode 62b is arranged between the first surface electrode 54b and the second surface electrode 55b. However, there is no limitation thereto.

For example, the inspection electrode 62a may be arranged on the outer side from the first surface electrode 54a or on the outer side from the second surface electrode 55a in the X direction. Similarly, for example, the inspection electrode 62b may be arranged on the outer side from the first surface electrode 54b or on the outer side from the second surface electrode 55b in the X direction.

Further, in the embodiment described above, the inspection electrode 62a, 62b is overlapped in the Z direction with the high electric potential electrode 52 which is arranged on the surface disposed between the first piezoelectric layer 42 and the second piezoelectric layer 43. However, there is no limitation thereto. The inspection electrode may be overlapped in the Z direction with the low electric potential electrode 53 which is arranged on the surface disposed between the vibration plate 41 and the first piezoelectric layer 42.

Further, in the embodiment described above, the length Ly in the Y direction of the piezoelectric actuator is shorter than the length Lx in the X direction. However, there is no limitation thereto. The length Ly may be not less than the length Lx.

Further, the inspection method for the piezoelectric actuator is not limited to the method explained in the foregoing embodiment. In a third modified embodiment, the inspection is performed for the piezoelectric actuator in accordance with a flow depicted in FIG. 17. Note that in the following description, an explanation will be made as exemplified by a case in which the inspection for the piezoelectric actuator 22 is performed by way of example. However, the inspection can be performed in accordance with any method which is the same as or equivalent to the method explained below, in relation to the other piezoelectric actuators as explained above as well.

Figure 17:
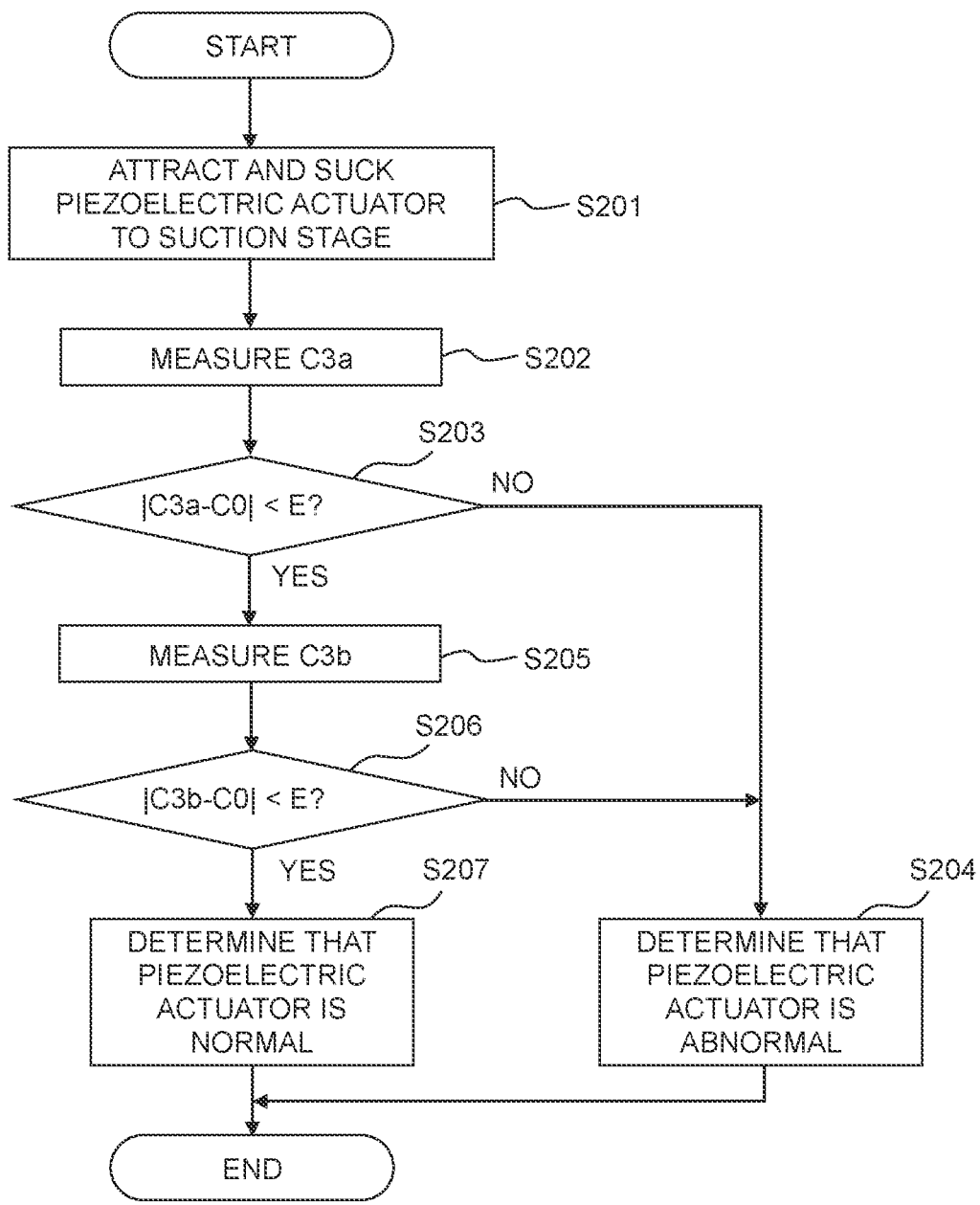
FIG. 17 depicts a flow chart illustrating a procedure of the inspection for the piezoelectric actuator.

As depicted in FIG. 17, also in the third modified embodiment, the piezoelectric actuator 22 is attracted and sucked to the suction stage 101 in the same manner as the embodiment described above (S201). Subsequently, the two probes 103 are applied to the inspection electrode 62a and the second surface electrode 55a to measure the electrostatic capacity C3a between the inspection electrode 62a and the high electric potential electrode 52 (S202).

Subsequently, it is judged whether or not the absolute value |C3a−C0| of the difference between the measured electrostatic capacity C3a and the reference value C0 of the electrostatic capacity is less than a predetermined value E (S203). If the absolute value |C3a−C0| is not less than the predetermined value E (S203: NO), it is judged that the piezoelectric actuator 22 is abnormal (S204).

If the absolute value |C3a−C0| is less than the predetermined value E (S203: YES), the two probes 103 are subsequently applied to the inspection electrode 62b and the second surface electrode 55b to measure the electrostatic capacity C3b between the inspection electrode 62b and the high electric potential electrode 52 (S205).

Subsequently, it is judged whether or not the absolute value |C3b−C0| of the difference between the measured electrostatic capacity C3b and the reference value C0 is less than the predetermined value E (S206). If the absolute value |C3b−C0| is not less than the predetermined value E (S206: NO), it is judged that the piezoelectric actuator 22 is abnormal (S204). If the absolute value |C3b−C0| is less than the predetermined value E (S206: YES), it is judged that the piezoelectric actuator 22 is normal (S207).

As described above, in the third modified embodiment, the degree of the warpage at the end portion in the Y direction of the piezoelectric actuator 22 can be grasped on the basis of the absolute value of the difference between the electrostatic capacity C3a between the inspection electrode 62a, 62b and the high electric potential electrode 52 and the reference value C0 to judge whether the piezoelectric actuator 22 is normal or abnormal.

Further, in the foregoing description, the exemplary case has been explained, in which the present disclosure is applied to the piezoelectric actuator for constructing the head for discharging the inks from the nozzles and the inspection therefor. However, there is no limitation thereto. The present disclosure can be also applied to any piezoelectric actuator for constructing any apparatus or device other than the head and the inspection therefor.

What is claimed is:

1. A piezoelectric actuator comprising:
a vibration plate having insulation performance at least on a first surface, of the vibration plate, disposed on a first side in a first direction of the vibration plate;
a first piezoelectric layer arranged on the first surface of the vibration plate;
a second piezoelectric layer arranged on a first surface, of the first piezoelectric layer, disposed on the first side in the first direction of the first piezoelectric layer;
a plurality of individual electrodes arranged on a first surface, of the second piezoelectric layer, disposed on the first side in the first direction of the second piezoelectric layer;
a first common electrode which is arranged between the vibration plate and the first piezoelectric layer and which is common to the plurality of individual electrodes;
a second common electrode which is arranged between the first piezoelectric layer and the second piezoelectric layer and which is common to the plurality of individual electrodes;
a first surface electrode which is arranged on the first surface of the second piezoelectric layer and which is in conduction with the first common electrode; and
a second surface electrode which is arranged on the first surface of the second piezoelectric layer and which is in conduction with the second common electrode, wherein:
one of the first and second common electrodes extends to an end portion in a second direction of a surface on which the one of the first and second common electrodes is arranged, the second direction being orthogonal to the first direction; and
the piezoelectric actuator further comprises an inspection electrode which is arranged on the first surface of the second piezoelectric layer at an end portion in the second direction of the second piezoelectric layer, which is overlapped in the first direction with the one of the first and second common electrodes, and which is not in conduction with any of the plurality of individual electrodes, the first common electrode, and the second common electrode.

2. The piezoelectric actuator according to claim 1, wherein lengths in the second direction of the vibration plate, the first piezoelectric layer, and the second piezoelectric layer are shorter than lengths in a third direction of the vibration plate, the first piezoelectric layer, and the second piezoelectric layer, respectively, the third direction being orthogonal to each of the first direction and the second direction.

3. The piezoelectric actuator according to claim 1, wherein the one of the first and second common electrodes, is the second common electrode.

4. The piezoelectric actuator according to claim 1, wherein:
the first surface electrode is arranged on the first surface of the second piezoelectric layer at the end portion in the second direction of the second piezoelectric layer;
the second surface electrode is arranged on the first surface of the second piezoelectric layer at the end portion in the second direction of the second piezoelectric layer apart from the first surface electrode in a third direction orthogonal to each of the first direction and the second direction; and
the inspection electrode is arranged on the first surface of the second piezoelectric layer at a portion between the first surface electrode and the second surface electrode.

5. The piezoelectric actuator according to claim 4, comprising:
at least one non-conductive electrode which is disposed on the first surface of the second piezoelectric layer at a portion between the first surface electrode and the second surface electrode, which is not in conduction with any of the plurality of individual electrodes, the first common electrode, the second common electrode, and the inspection electrode, and which is different from the inspection electrode, wherein:
the at least one non-conductive electrode and the inspection electrode are aligned in the third direction.

6. The piezoelectric actuator according to claim 5, wherein:
the one of the first and second common electrodes has an overlapped portion which extends to a position at which the overlapped portion is overlapped in the first direction with the one of the first and second surface electrodes in conduction with the one of the first and second common electrodes;
the overlapped portion extends in the third direction to a position at which the overlapped portion is overlapped in the first direction with the inspection electrode; and
the inspection electrode is arranged on the first surface of the second piezoelectric layer at a portion between the at least one non-conductive electrode and the one of the first and second surface electrodes.

7. The piezoelectric actuator according to claim 5, wherein a length in the second direction of the inspection electrode is longer than a length in the second direction of the at least one non-conductive electrode.

8. The piezoelectric actuator according to claim 7, wherein the inspection electrode has two electrode portions which are connected to one another while being aligned in the third direction and each of which has oblong shape obtained by being projected in the first direction, a longitudinal direction of the oblong shape being the second direction.

9. The piezoelectric actuator according to claim 8, wherein the two electrode portions are deviated from each other in the second direction.

10. The piezoelectric actuator according to claim 7, wherein the inspection electrode has a shape which is obtained by being projected in the first direction and which is a parallelogram having a pair of opposing sides parallel to the second direction.

11. The piezoelectric actuator according to claim 7, wherein the inspection electrode has:
- a first electrode portion which extends in the second direction;
- a second electrode portion which is arranged while being separated in the third direction from the first electrode portion, which extends in the second direction, and which is arranged while being deviated to one side in the second direction with respect to the first electrode portion; and
- a third electrode portion which connects an end portion of the first electrode portion disposed on the one side in the second direction and an end portion of the second electrode portion disposed on an opposite side in the second direction, wherein:
- a length in the second direction between an end on the opposite side in the second direction of the first electrode portion and an end on the one side in the second direction of the second electrode portion is longer than a length in the second direction of the the at least one non-conductive electrode.

12. An inspection method for the piezoelectric actuator as defined in claim 1, the inspection method comprising:
- sucking and attracting the piezoelectric actuator with respect to a base member;
- applying probes to the inspection electrode and the one of the first and second common electrodes to measure an electrostatic capacity between the inspection electrode and the one of the first and second common electrodes; and
- determining that the piezoelectric actuator is normal in a case that a difference between the measured electrostatic capacity and a reference value of the electrostatic capacity is less than a predetermined value; or
- determining that the piezoelectric actuator is abnormal in a case that the difference between the measured electrostatic capacity and the reference value is not less than the predetermined value.

13. An inspection method for the piezoelectric actuator as defined in claim 1, the inspection method comprising:
- sucking and attracting the piezoelectric actuator with respect to a base member;
- applying probes to an end portion on a first side in the second direction of the inspection electrode and the one of the first and second common electrodes to measure a first electrostatic capacity as an electrostatic capacity between the inspection electrode and the one of the first and second common electrodes in a state in which one of the probes applied to the inspection electrode is pressed against the base member;
- applying the probes to an end portion on a second side in the second direction of the inspection electrode and the one of the first and second common electrodes to measure a second electrostatic capacity as an electrostatic capacity between the inspection electrode and the one of the first and second common electrodes in a state in which the probe applied to the inspection electrode is pressed against the base member; and
- determining that the piezoelectric actuator is normal in a case that a difference between the first electrostatic capacity and the second electrostatic capacity is less than a predetermined value; or
- determining that the piezoelectric actuator is abnormal in a case that the difference between the first electrostatic capacity and the second electrostatic capacity is not less than the predetermined value.

14. An inspection method for the piezoelectric actuator as defined in claim 7, the inspection method comprising:
- sucking and attracting the piezoelectric actuator with respect to a base member;
- applying probes to an end portion on a first side in the second direction of the inspection electrode and the one of the first and second common electrodes to measure a first electrostatic capacity as an electrostatic capacity between the inspection electrode and the one of the first and second common electrodes in a state in which one of the probes applied to the inspection electrode is pressed against the base member;
- applying the probes to an end portion on a second side in the second direction of the inspection electrode and the one of the first and second common electrodes to measure a second electrostatic capacity as an electrostatic capacity between the inspection electrode and the one of the first and second common electrodes in a state in which the probe applied to the inspection electrode is pressed against the base member; and
- determining that the piezoelectric actuator is normal in a case that a difference between the first electrostatic capacity and the second electrostatic capacity is less than a predetermined value; or
- determining that the piezoelectric actuator is abnormal in a case that the difference between the first electrostatic capacity and the second electrostatic capacity is not less than the predetermined value.

* * * * *